US009899725B2

(12) United States Patent
Soliman et al.

(10) Patent No.: US 9,899,725 B2
(45) Date of Patent: Feb. 20, 2018

(54) CIRCUITRY-ISOLATED MEMS ANTENNAS: DEVICES AND ENABLING TECHNOLOGY

(75) Inventors: Ezzeldin A. Soliman, New Cairo (EG); Sherif Sedky, New Cairo (EG); Mai O. Sallam, New Cairo (EG); Ahmed Kamal Said Abdel Aziz, New Cairo (EG)

(73) Assignee: AMERICAN UNIVERSITY IN CAIRO, New Cairo (EG)

(*) Notice: Subject to any disclaimer, the term of this patent is extended or adjusted under 35 U.S.C. 154(b) by 975 days.

(21) Appl. No.: 13/516,792

(22) PCT Filed: Dec. 18, 2010

(86) PCT No.: PCT/IB2010/003487

§ 371 (c)(1),
(2), (4) Date: Oct. 17, 2012

(87) PCT Pub. No.: WO2011/073802

PCT Pub. Date: Jun. 23, 2011

(65) Prior Publication Data

US 2013/0044037 A1 Feb. 21, 2013

Related U.S. Application Data

(60) Provisional application No. 61/287,876, filed on Dec. 18, 2009.

(51) Int. Cl.

*H01Q 1/22* (2006.01)
*H01Q 1/24* (2006.01)

(Continued)

(52) U.S. Cl.

CPC .......... *H01Q 1/2283* (2013.01); *H01Q 1/243* (2013.01); *H01Q 1/38* (2013.01); *H01Q 5/385* (2015.01);

(Continued)

(58) Field of Classification Search

CPC ..................... H01Q 1/2283; H01L 2223/6677

(Continued)

(56) References Cited

U.S. PATENT DOCUMENTS

2006/0158378 A1 7/2006 Pons et al. .................... 343/700
2009/0149038 A1 6/2009 Gabara ........................... 439/55
2009/0156137 A1 6/2009 Rofougaran et al. ........... 455/77

OTHER PUBLICATIONS

International Search Report and Written Opinion in PCT/IB2010/003487 dated Jun. 22, 2011.

*Primary Examiner* — Robert Karacsony
(74) *Attorney, Agent, or Firm* — Norton Rose Fulbright US LLP

(57) ABSTRACT

Embodiments of a MEMS antenna are presented. Additionally, systems incorporating embodiments of a MEMS antenna are presented. Methods of manufacturing a MEMS antenna are also presented. In one embodiment, the MEMS antenna includes a substrate, a metallic layer disposed over the substrate, the metallic layer forming a ground plane, the ground plane having a region defining a gap disposed therein, a protrusion disposed over the substrate within the region defining the gap, the protrusion extending outwardly from the ground plane, the protrusion having a length and a width, the length being greater than the width, and a first electromagnetic radiator element disposed over the protrusion, the first electromagnetic element having a length and a width, the length being greater than the width.

24 Claims, 33 Drawing Sheets

(51) Int. Cl.

| | |
|---|---|
| ***H01Q 1/38*** | (2006.01) |
| ***H01Q 9/28*** | (2006.01) |
| ***H01Q 21/26*** | (2006.01) |
| ***H01Q 21/30*** | (2006.01) |
| ***H01Q 23/00*** | (2006.01) |
| ***H01Q 5/385*** | (2015.01) |

(52) U.S. Cl.
CPC ............. *H01Q 9/285* (2013.01); *H01Q 21/26* (2013.01); *H01Q 21/30* (2013.01); *H01Q 23/00* (2013.01); *H01L 2223/6677* (2013.01)

(58) Field of Classification Search
USPC .................................................. 343/729, 730
See application file for complete search history.

CIRCUITRY-ISOLATED MEMS ANTENNAS: DEVICES AND ENABLING TECHNOLOGY

CROSS-REFERENCE TO RELATED APPLICATIONS

This application is a national phase application under 35 U.S.C. § 371 of International Application No. PCT/IB2010/003487 filed 18 Dec. 2010, which claims priority to U.S. Provisional Application No. 61/287,876 filed 18 Dec. 2009. The entire contents of each of the above-referenced disclosures is specifically incorporated herein by reference without disclaimer.

BACKGROUND OF THE INVENTION

Field of the Invention

This invention relates to Mircroelectromecanical systems (MEMS) antennas and more particularly relates to an apparatus system and method for circuitry-isolated MEMS antennas.

Description of the Related Art

The frequency scaling law states that as frequency increases the size of the antenna and distributed microwave circuit decreases. Due to the recent advances in technology that allows for fabricating small devices, the realization of miniaturized wireless equipment operating at high frequencies becomes feasible. This explains the recent interests in the millimeter-wave (mm-wave) range that starts from 30 GHz up to 300 GHz. Several frequencies within this band are already allocated for a number of applications, as listed in Table I.

TABLE I

Assigned Wireless Applications in the mm-Wave Range

| Frequency | Assigned Applications |
|---|---|
| 35 GHz | Pavement and bridge assessment.<br>Liquid level measurement.<br>Detection and location of buried mines and unexploded ordnance (UXO).<br>Detection of intrusion to structures including important civil facilities.<br>Detection of slow moving objects.<br>Surveillance and monitoring of hidden activities and objects.<br>Detection of intruders and moving vehicles, security, obstacle detection for robotic equipment, traffic monitoring and control.<br>Military seeker and sensor applications for munitions and missiles. |
| 60 GHz | Wireless personal area network (WPAN) applications and video streaming applications.<br>Indoor ultra-high speed short-range wireless communication.<br>Multimedia applications.<br>Inter-satellite links.<br>Distance estimation. |
| 77 GHz | Automotive Radars (car radars). |
| 71-76 GHz and 81-86 GHz | Outdoor 10 Gbps networks. |
| 94 GHz | Medical and security imaging applications.<br>Cloud Radar systems.<br>Cloud profiling radar antenna system.<br>Missile guidance and collision avoidance.<br>Research radar for study of severe weather and clouds.<br>Development and instrumentation radar.<br>Military applications. |
| 140-220 GHz | High-data rate wireless indoor communication systems.<br>Direct detection radiometers for remote atmospheric sensing.<br>High-resolution passive and active mm-wave imaging applications.<br>Systems for detection of concealed weapons, and aircraft navigation in zero visibility conditions.<br>Plasma Imaging Camera. |
| 278 GHz | Radiometer systems for long-term ground-based monitoring of the vertical profiles of chlorine monoxide and ozone in the stratosphere over the arctic area. |

As frequency of operation increases, the antenna's dielectric losses increase significantly due to the excitation of surface waves inside the substrate carrying the antenna. This serious drawback deteriorates the performance of the conventional planar antennas, such as patches, in the mm-wave range of frequencies. An attractive solution to this problem is the use of the micromachining technology. Typically, the main idea behind the use of this technology for antennas is to etch away as much as possible dielectric volume around the radiating elements. This reduces surface wave losses significantly and allows for high radiation efficiency and gain even at high resonance frequencies. The reduction of substrate losses leads to enhancing battery life time of mobile and hand-held equipment. Moreover, MEMS antennas are still compatible with the driving circuit technology and can be monolithically integrated with the entire millimeter-wave system. Such compatibility leads to miniaturized wireless systems which obey the evolution towards compactness.

MEMS antennas can be classified into two main categories. The first category features one silicon wafer 102 machined such that to create a cavity 104 underneath the antenna 106, as shown in FIG. 1(*a*). This cavity 104 reduces the effective dielectric constant around the antenna 106 and consequently decreases substrate losses and increases radiation efficiency. Although this category enjoys low fabrication cost, it suffers from significant interference between the antenna 106 and the feeding circuit 108. This is because of the fact that both antenna and circuit are located at one side of the ground plane 110. The second category of MEMS antennas features two silicon wafers 102 bonded to each other with a slotted ground plane 110 in between them, as shown in FIG. 1(*b*). One wafer 102 is micromachined and carrying the antenna 106, while the other one is carrying the driving circuit 108. Due to the presence of a ground plane 110 between the antenna 106 and circuit 108, the interference between them is minimal. This comes on the expenses of increasing the fabrication cost owing to the required wafer bonding process.

SUMMARY OF THE INVENTION

Embodiments of MEMS antennas are presented. In one embodiment, only one silicon wafer is required while ground plane isolation between the MEMS antenna and circuit exists. Additional embodiments of the MEMS antenna may have diversity in polarization and radiation characteristics. In one embodiment, the frequency of operation of the MEMS antennas is 60 GHz. One of ordinary skill in the art will recognize, however, that these antennas may be tuned for operation at any other frequency within the mm-wave range. While maintaining the same geometry, increasing antenna dimensions results in reducing the frequency of operation, and vice verse. Methods of manufacturing the MEMS antenna may remain substantially the same for the entire range of dimensions along the mm-wave range. In further embodiments, the MEMS antenna may be manufactured on either high-resistivity (2,000 Ω·cm) or low-resistivity (45 Ω·cm) silicon wafers. In a particular embodiment, the wafers may have a thickness of 675 μm and dielectric constant of 11.9.

In one embodiment, the MEMS antenna includes a substrate, a metallic layer disposed over the substrate, the metallic layer forming a ground plane, the ground plane having a region defining a gap disposed therein, a protrusion disposed over the substrate within the region defining the gap, the protrusion extending outwardly from the ground plane, the protrusion having a length and a width, the length being greater than the width, and a first electromagnetic radiator element disposed over the protrusion, the first electromagnetic element having a length and a width, the length being greater than the width.

The MEMS antenna may also include a Through-Silicon Via (TSV) extending through the substrate from a first surface of the substrate to a second surface of the substrate. The TSV may have a length which extends perpendicularly to the length of the first electromagnetic radiator element. In a further embodiment, the TSV has a first end and a second end. Additionally, the first electromagnetic radiator element may include a first end and a second end, In such an embodiment, the first end of the TSV may be disposed adjacent to the first end of the first electromagnetic radiator element. In one embodiment, the first end of the TSV may be separated from the first end of the first electromagnetic radiator element by a gap.

In one embodiment, the length of the first electromagnetic radiator element is equal to one-half a wavelength of a standing electromagnetic wave to be radiated by the first electromagnetic radiator element.

In a further embodiment, the MEMS antenna may include a second protrusion disposed over the substrate within the region defining the gap, the second protrusion extending outwardly from the ground plane, the second protrusion having a length and a width, the length being greater than the width, and a second electromagnetic radiator element disposed over the second protrusion, the second electromagnetic element having a length and a width, the length being greater than the width.

In one embodiment, the length of the second electromagnetic radiator element may also be equal to one-half a wavelength of a standing electromagnetic wave to be radiated by the second electromagnetic radiator element. In an additional embodiment, the first electromagnetic radiator element and the second electromagnetic radiator element are arranged in a linearly polarized configuration. In certain embodiments, the first electromagnetic radiator element and the second electromagnetic radiator element each comprise a half-wavelength dipole. In one embodiment, the length of the first electromagnetic radiator element and the length of the second electromagnetic radiator element are disposed within a common plane.

In an embodiment, the MEMS antenna may include a second TSV extending through the substrate from a first surface of the substrate to a second surface of the substrate, wherein the second TSV comprises a first end and a second end, and the second electromagnetic radiator element comprises a first end and a second end, and wherein the first end of the second TSV is disposed adjacent to the first end of the second electromagnetic radiator element.

In one embodiment, the wherein the length of the first electromagnetic radiator element and the length of the second electromagnetic radiator element are disposed within separate parallel planes. In such an embodiment, the second electromagnetic radiator element may be a parasitic half-wavelength dipole.

In one embodiment, the MEMS antenna also includes a third protrusion disposed over the substrate within the region defining the gap, the third protrusion extending outwardly from the ground plane, the third protrusion having a length and a width, the length being greater than the width, a third electromagnetic radiator element disposed over the third protrusion, the third electromagnetic element having a length and a width, the length being greater than the width, a fourth protrusion disposed over the substrate within the region defining the gap, the fourth protrusion extending outwardly from the ground plane, the fourth protrusion having a length and a width, the length being greater than the width, and a fourth electromagnetic radiator element disposed over the fourth protrusion, the fourth electromagnetic element having a length and a width, the length being greater than the width.

In an embodiment, the first and second electromagnetic radiator elements are active half-wavelength dipoles, and the third and fourth electromagnetic radiator elements are parasitic halve-wavelength dipoles. The first electromagnetic radiator element may be disposed at an angle that is perpendicular to an angle of the second electromagnetic radiator element, and the third electromagnetic radiator element may be disposed at an angle that is perpendicular to an angle of the fourth electromagnetic radiator element. In a further embodiment, the first electromagnetic radiator element is disposed within a first plane, and the third electromagnetic radiator element is disposed within a second plane, and the first plane is parallel to the second plane. In particular, the first electromagnetic radiator element, the second electromagnetic radiator element, the third electromagnetic radiator element, and the fourth electromagnetic radiator element may be arranged in a circularly polarized configuration.

In one embodiment, the first electromagnetic radiator element and the second electromagnetic radiator element are coupled together by a ring coupler. The ring coupler may include a microstrip line disposed on a surface of the substrate that is opposite a surface of the substrate over which the first electromagnetic radiator element and the second electromagnetic radiator element are disposed. In a further embodiment, the ring coupler has a first port and a second port. In such an embodiment, power delivered through the first port is delivered equally to the first electromagnetic radiator element and the second electromagnetic radiator element, but with a one hundred and eighty degree phase shift. Power delivered through the second port may be delivered equally to the first electromagnetic radiator element and the second electromagnetic radiator element with a zero degree phase shift. In such an embodiment, the first electromagnetic radiator element and the second electromagnetic radiator element may be configured to operate as a dipole antenna when power is applied to the first port and configured to operate as a monopole antenna when power is applied to the second port.

In a further embodiment, the MEMS antenna may include a plurality of additional protrusions disposed over the substrate within the region defining the gap, the plurality of additional protrusions extending outwardly from the ground plane, the plurality of additional protrusions each having a length and a width, the length being greater than the width. The MEMS antenna may also include a plurality of additional electromagnetic radiator elements, each disposed over one of the plurality of additional protrusions, the plurality additional electromagnetic elements each having a length and a width, the length being greater than the width. In such an embodiment, the first electromagnetic radiator element and the plurality of additional electromagnetic radiator elements are arranged in a wire-grid array configuration.

A system is also presented. In one embodiment, the system includes a substrate having a first surface and a second surface, the first surface being disposed opposite the second surface. The system may also include a MEMS antenna disposed over the first surface, the MEMS antenna. The MEMS antenna may include a metallic layer disposed over the first surface of the substrate, the metallic layer forming a ground plane, the ground plane having a region defining a gap disposed therein, a protrusion disposed over the substrate within the region defining the gap, the protrusion extending outwardly from the ground plane, the protrusion having a length and a width, the length being greater than the width, and a first electromagnetic radiator element disposed over the protrusion, the first electromagnetic element having a length and a width, the length being greater than the width. Additionally, the system may include an antenna driver circuit coupled to the second surface, the antenna driver circuit being coupled to the MEMS antenna by one or more vias extending from the first surface through the substrate to the second surface.

The system may additionally include the various other embodiments of the MEMS antenna described above.

A method for manufacturing a MEMS antenna is also presented. In one embodiment, the method includes providing a substrate having a first surface and a second surface, the first surface being disposed opposite the second surface. The method may also include forming an oxide layer on at least one of the first surface and the second surface. Additionally, the method may include patterning the oxide layer in regions sufficient to form a protrusion disposed over the first surface of the substrate. An embodiment of the method may also include etching away at least a portion of the first surface of the substrate to form the protrusion disposed over the first surface of the substrate. Further, the method may include depositing a metal layer over a portion of the first surface of the substrate to form a ground plane, the ground plane having a region defining a gap disposed therein, the protrusion being disposed within the region defining a gap. Additionally, the method may include depositing a metal layer over the protrusion to form an electromagnetic radiator element.

A further embodiment of the method may include etching a hole through the substrate from the first surface to the second surface, and depositing a metal layer in the hole to form a via electrically coupling at least a portion of the first surface to at least a portion of the second surface.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1A:
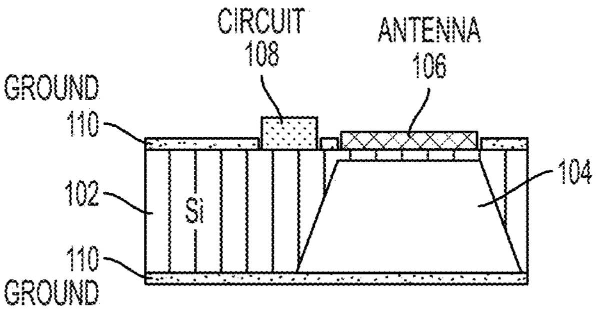
FIG. 1 is a schematic block diagram illustrating one embodiment of a system for two conventional categories of MEMS antennas: (a) using single wafer, and (b) using two bonded wafers.
Figure 1B:
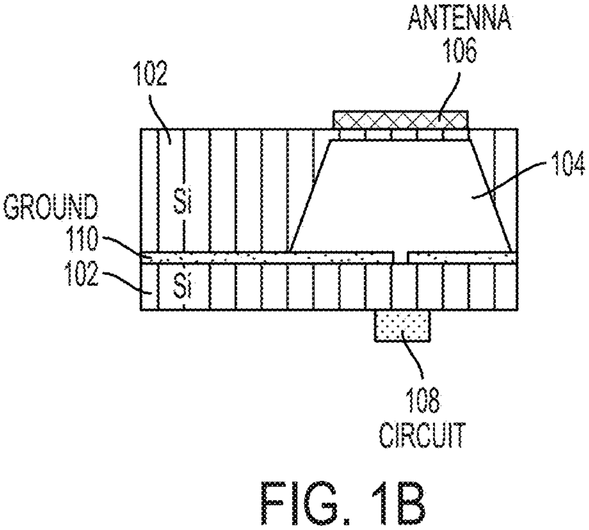
Figure 2:
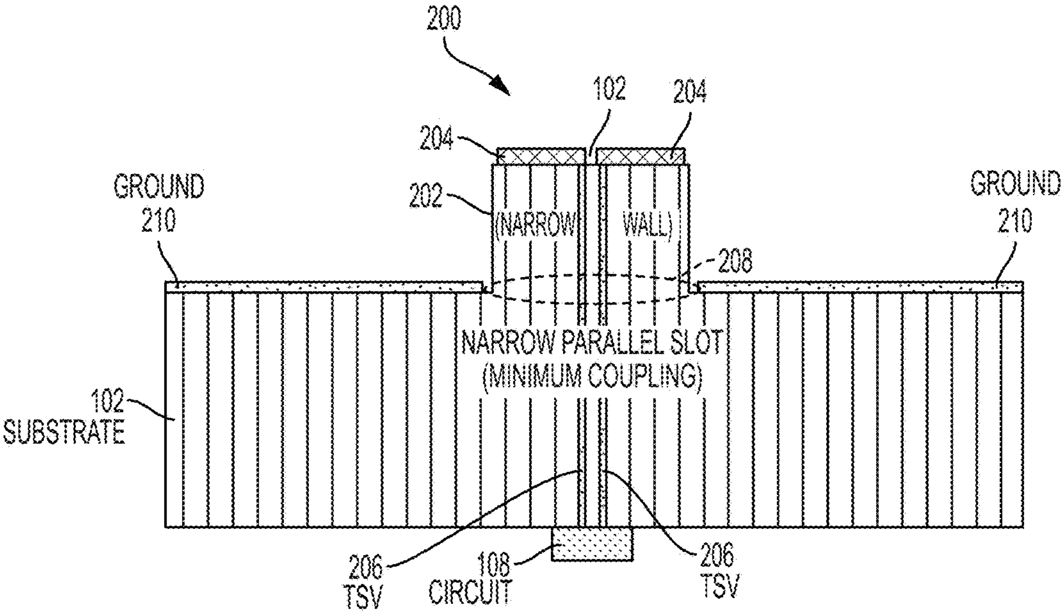
FIG. 2 is a schematic block diagram illustrating one embodiment of a system that includes MEMS antennas.
Figure 3A:
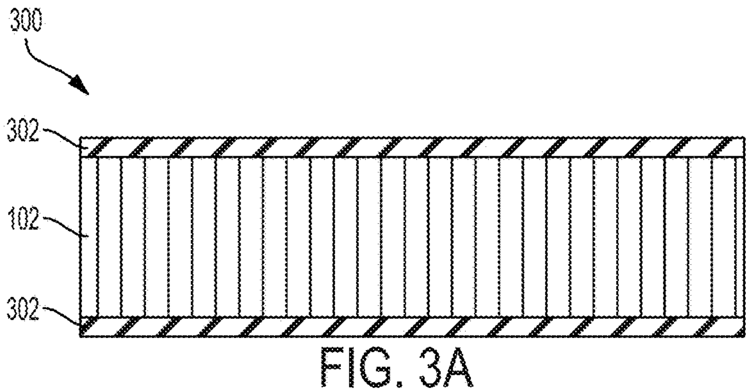
FIG. 3(*a*)-(*d*) is a schematic block diagram illustrating one embodiment of a method for the process flow of the proposed MEMS antennas: (a) start-up wafer, (b) patterning of oxide on both sides, (c) deep etching of silicon from both sides, and (d) platting copper on both side.
Figure 3B:
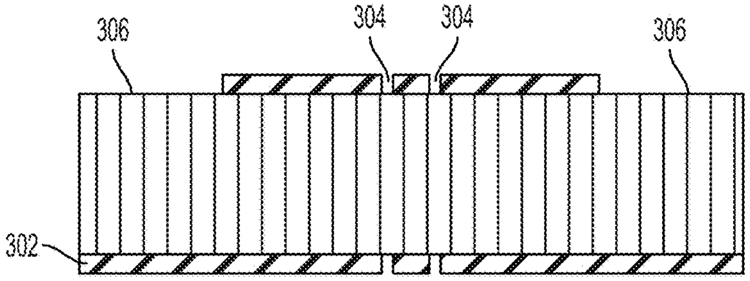
Figure 3C:
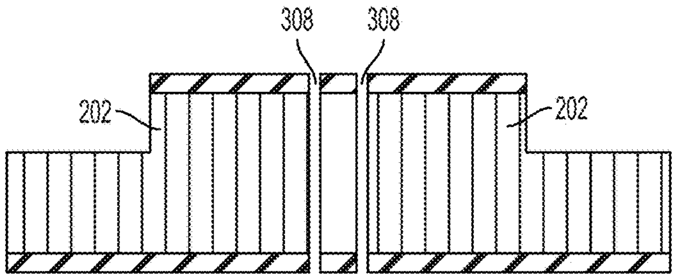
Figure 3D:
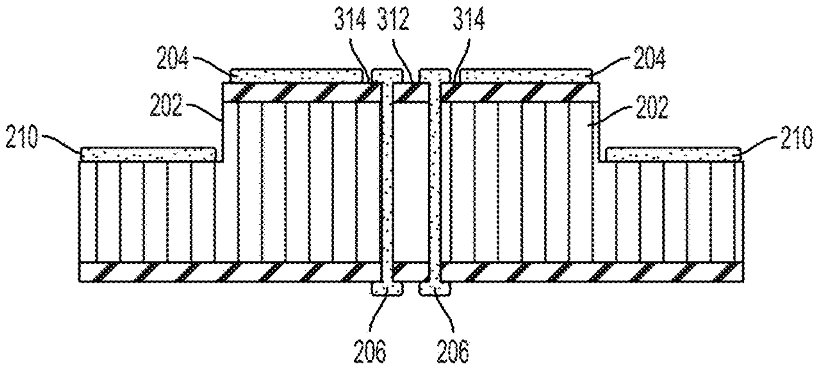
Figure 4A:
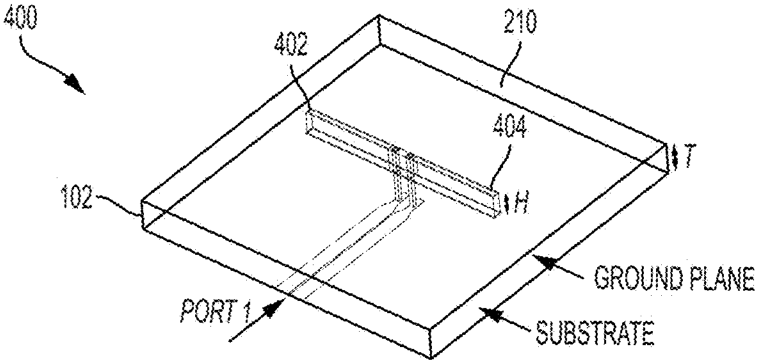
FIG. 4(*a*)-(*c*) shows a geometry of an embodiment of a linearly polarized MEMS antenna: (a) 3D zoom-out view, (b) 3D zoom-in view, and (c) top-view.
Figure 4B:
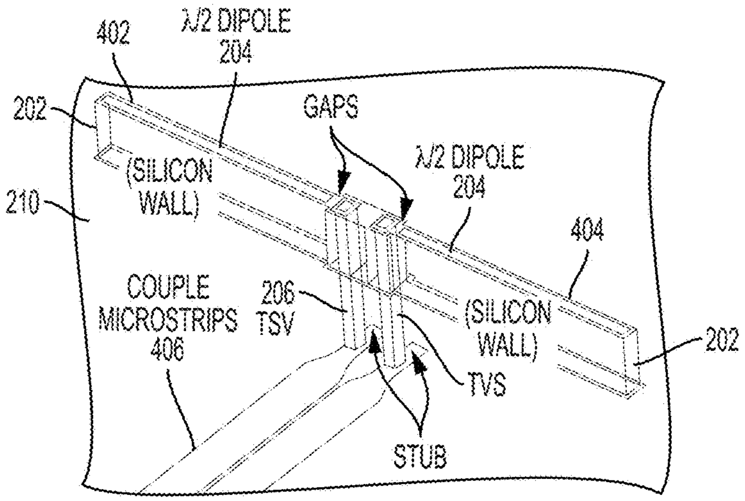
Figures 1, 4C:
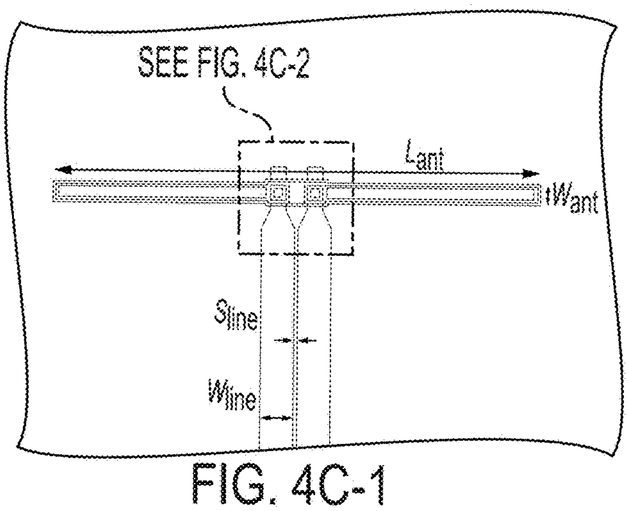
Figures 2, 4C:
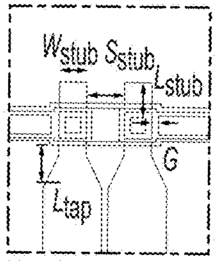

One embodiment of a MEMS antennas 200 includes one or more narrow vertical silicon walls 202. These walls 202 may carry wire-radiators 204 on top of them, as shown in FIG. 2. The walls 202 may be positioned on top of a silicon substrate 102 that is carrying the feeding circuit 108 from the other side. The connection between the circuit 108 and radiators 204 is performed using Through-Silicon Vias (TSVs 206) which are running through the entire silicon wafer 102. The substrate's 102 side facing the walls 202 may be covered with slotted ground plane 210 through which the walls 202 are penetrating outwardly. In this way, the top side of the ground plane 210 may include the MEMS antenna 200 surrounded by air, while the back side of the ground plane 210 may include the substrate 102 carrying the driving circuit 108. As such, isolation between the MEMS antenna 200 and circuit 108 may be maintained using single wafer 102 without the need for wafer bonding or hybrid integration. In one embodiment, the narrow slot 208 in the ground plane 210 is parallel to the wire-radiator 204, which may reduce coupling between them and consequently negligible radiation from the narrow slot 208.

The process 300 flow for fabricating the new category of MEMS antennas 200 may require as few as three processing steps. Embodiments of steps of the process 300 are illustrated in FIG. 3. In one embodiment, the process 300 starts with a silicon wafer 102. The wafer 102 may be either high- or low-resistivity. In a particular embodiment, the wafer 102 thickness is 675 μm, as show in FIG. 3(*a*). The wafer 102 may be coated with oxide 302 on both sides, which acts as an etching mask for deep silicon etching. For example, the wafer 102 may be coated with 4 μm of oxide 302. In one embodiment, the first step in the process 200 flow is to pattern the oxide 302 on one or both sides to define holes 304 for forming the openings 308 of the TSVs 206 and holes 306 for forming the walls 202, as shown in FIG. 3(*b*). In one embodiment, the top silicon surface may be etched using cryogenic deep reactive ion etching for certain depth, as shown in FIG. 3(*c*). One of ordinary skill in the art will recognize other etching processes that are suitable for forming the walls 202 and openings 308 of the TSVs 206. Cryogenic etching may be advantageous because it may achieve smoother vertical walls that other etch methods. The TSVs 206 connecting the feeding circuit 108 at the backside to the radiators 204 on top of the walls 202 are etched also from the backside as illustrated in FIG. 3(*c*). They may be etched using the same method. As illustrated in FIG. 3(*d*), a metallic layer may be deposited on both sides of the wafer to cover the following: (1) the top sides of the walls to create the radiators 204, (2) the through halls to create the vertical connectors, (3) the top side of the substrate around the walls to create the slotted ground plane, and (4) selectively the bottom side of the substrate to create the feeding microwave circuit. In one embodiment, the metallic layer may be a 1-5 μm thick copper layer. Alternatively, the layer may be gold, aluminum, or other materials suitable to form the gapped ground plane 210 and the radiators 204.

In addition, as illustrated in FIG. 3(*d*), the MEMS antenna 200 may include a gap 314 between the TSVs 206 and the radiators 204. The gap 314 may substantially eliminate the current flow through the radiators 204, causing the formation of a standing wave on each radiator 204 during use. The MEMS antenna 200 may also include a continuation 312 of the gapped ground plane 210 for isolation of the two radiators 204.

An embodiment of a linearly polarized MEMS antenna 400 is shown in FIG. 4. This embodiment may include two horizontal arms 402. In one embodiment, the two horizontal arms each comprise a thin wall 202 and a radiator 204. For example, the radiators 204 may be copper each of which has a length of $\lambda_g/2$. Each of these arms 402 may operate as a radiating half-wavelength dipole. The two dipoles 204 may be formed or placed on top of a very narrow silicon wall 202 that is formed using bulk micromachining technology. Two vertical TSVs 206 may be drilled or etched through the entire wafer 102 to create vertical arms of the antenna 400. These arms 206 may be coupled to a 50Ω feeding coupled microstrip line 406 that may run below the substrate 102. The upper side of the substrate may be covered with a slotted ground plane 210 through which the wall 202 is penetrating up. Two gaps 314 may be inserted between the vertical arms 206 and the horizontal arms 402. These gaps 314 may impose current nulls at their locations and result in well-defined standing wave patterns. An open circuit stub may be connected in parallel with the antenna to enhance the impedance matching. Table II lists the optimum set of dimensions of the linearly polarized MEMS antenna 400 as fabricated on both high- and low-resistivity silicon wafers.

TABLE II

GEOMETRICAL PARAMETERS OF AN EMBODIMENT OF A LINEARLY POLARIZED MEMS ANTENNA

| Antenna Geometrical Parameters | On High-Resistivity Silicon | On Low-Resistivity Silicon |
|---|---|---|
| H | 275 μm | 275 μm |
| T | 400 μm | 400 μm |
| $L_{ant}$ | 2.610 mm | 2.438 mm |
| $W_{ant}$ | 90 μm | 120 μm |
| G | 25 μm | 25 μm |
| $L_{tap}$ | 115 μm | 115 μm |
| $L_{stub}$ | 115 μm | 215 μm |
| $W_{stub}$ | 80 μm | 80 μm |
| $S_{stub}$ | 120 μm | 120 μm |
| $W_{line}$ | 180 μm | 180 μm |
| $S_{line}$ | 20 μm | 20 μm |

Figure 5:
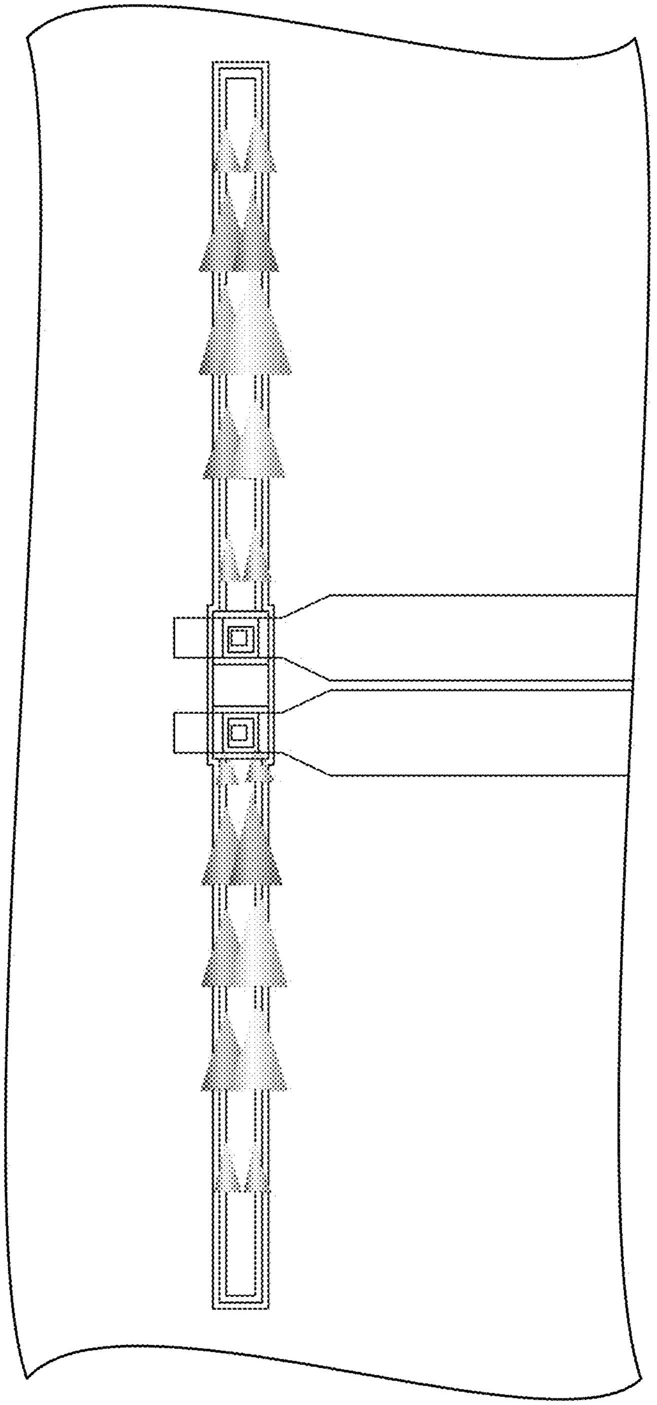
FIG. 5 shows the current distribution on the radiating arms of an embodiment of a linearly polarized MEMS antenna at 60 GHz.
Figure 6:
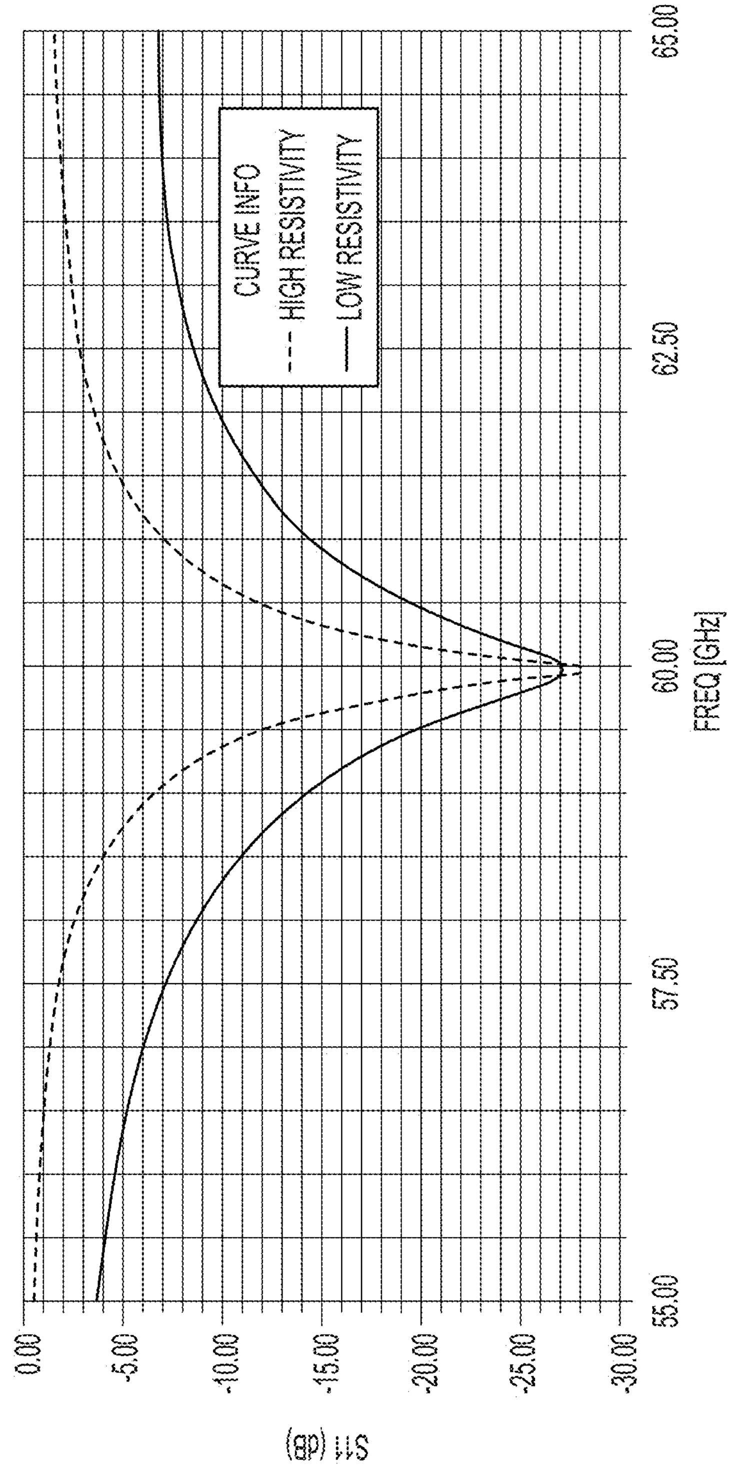
FIG. 6 shows a return loss versus frequency of an embodiment of a linearly polarized MEMS antenna.
Figure 7B:
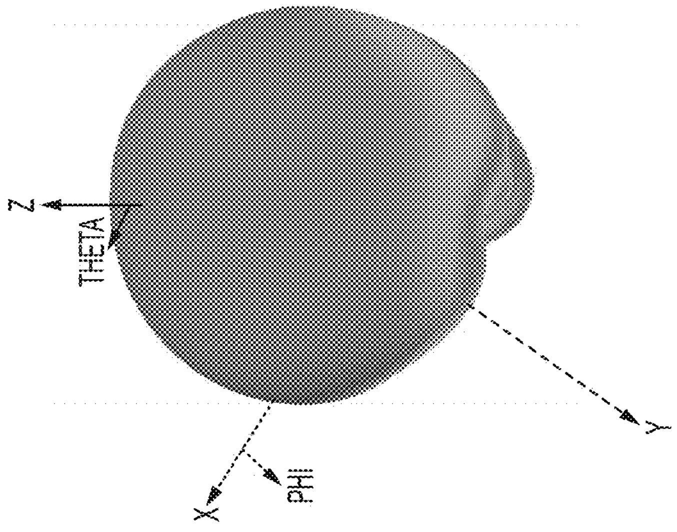
FIG. 7(*a*)-(*b*) show 3D radiation patterns of an embodiment of a linearly polarized MEMS antenna at 60 GHz: (a) on high-resistivity silicon, and (b) on low-resistivity silicon.
Figure 7A:
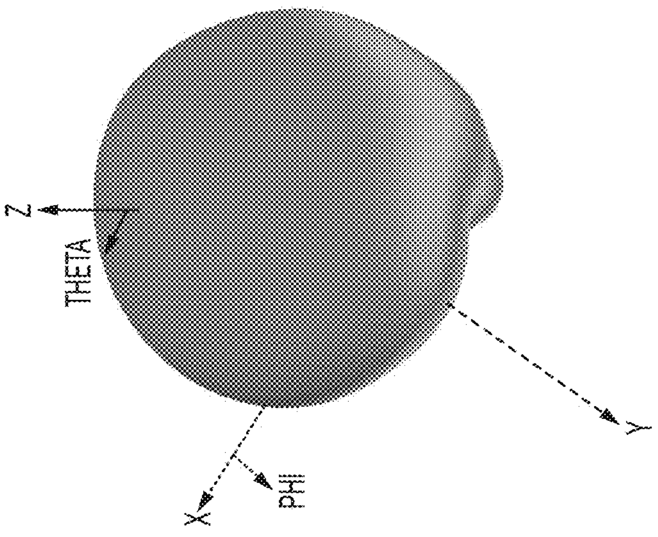
Figure 8:
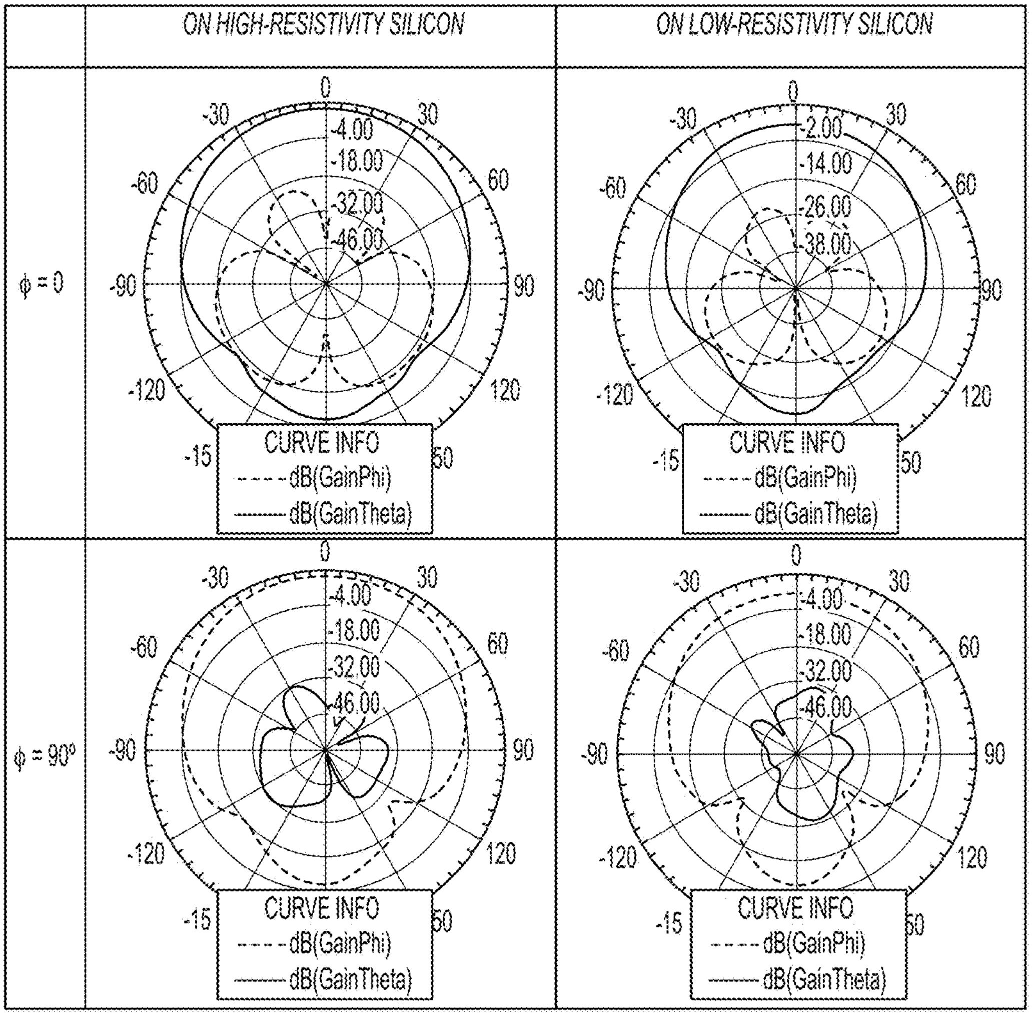
FIG. 8 shows radiation patterns in two orthogonal planes of an embodiment of a linearly polarized MEMS antenna at 60 GHz.
Figure 9A:
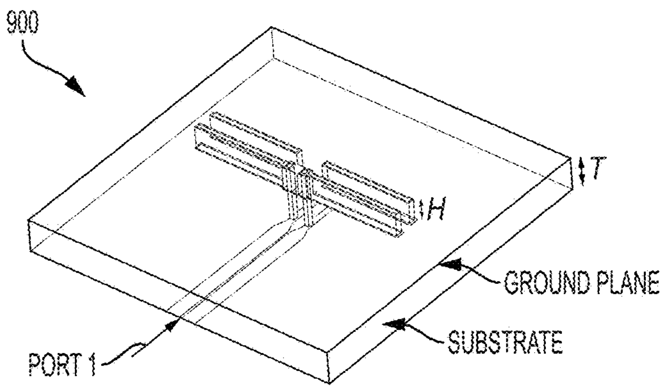
FIG. 9(*a*)-(*c*) show the geometry of an embodiment of a linearly polarized MEMS antenna with parasitic elements: (a) 3D zoom-out view, (b) 3D zoom-in view, and (c) top-view.
Figure 9B:
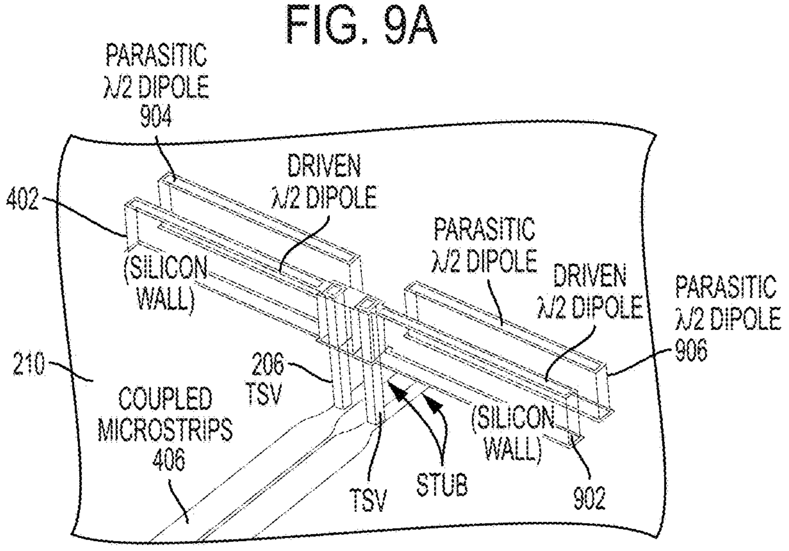
Figures 1, 9C:
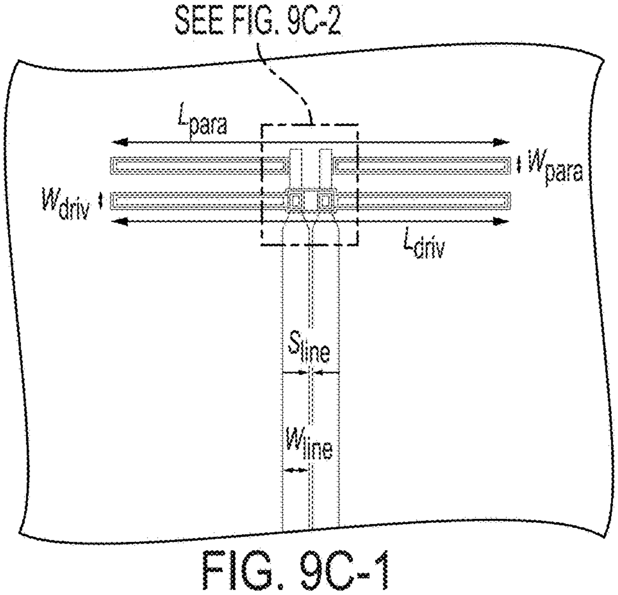
Figures 2, 9C:
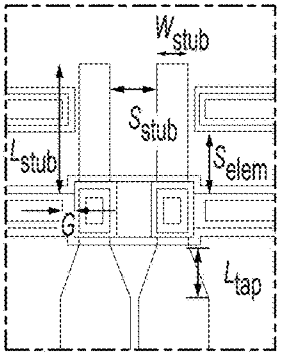

In one embodiment, the antenna may be excited with a differential mode of the feeding line, which may force the currents on the vertical arms to be opposite and hence cancel out. On the other hand, the currents on the horizontal arms may be in the same direction and they may add constructively to each other. A simulation of an embodiment of a linearly polarized MEMS antenna 400 may be performed using Ansoft/HFSS. FIG. 5 shows a current distribution on the radiating arms at 60 GHz, which shows half-wavelength current patterns on each arm in the same direction. FIG. 6 shows the return loss of an embodiment of the linearly polarized MEMS antenna 400 versus frequency as fabricated on both high- and low-resistivity silicon. According to these embodiments, both versions of the antenna resonate at 60 GHz as required. The 3D radiation patterns of this antenna at 60 GHz are presented in FIG. 7. Two orthogonal cuts in these patterns are shown in FIG. 8. The antenna 400 may be radiating mainly from the top side, which results in minimum interference with the driving circuit at the bottom side. The electric characteristics of an embodiment of a linearly polarized MEMS antenna 400 are listed in Table III.

TABLE III

CHARACTERISTICS OF AN EMBODIMENT OF A LINEARLY POLARIZED MEMS ANTENNA

| Antenna Characteristics | On High-Resistivity Silicon | On Low-Resistivity Silicon |
|---|---|---|
| Impedance Bandwidth (−10 dB) | 1.3 GHz (2.16%) | 3.62 GHz (6%) |
| Directivity | 7.87 dBi | 7.81 dBi |
| Radiation Efficiency | 94.10% | 35.60% |
| Gain | 7.61 dBi | 3.33 dBi |
| Communication Range ($P_{Tx}$ = 100 dBm and $P_{Rx}$ = −70 dBm) | 22.96 m | 8.57 m |
| Cross-Polarization Level @ Broadside | −50.20 dB | −39.40 dB |
| Maximum Cross-polarization Level (φ = 0 plane) | −24.00 dB | −22.13 dB |
| Maximum Cross-Polarization Level (φ = 90°plane) | −38.70 dB | −36.20 dB |
| Front-to-Back Ratio | 15.15 dB | 12.44 dB |

Figure 10:
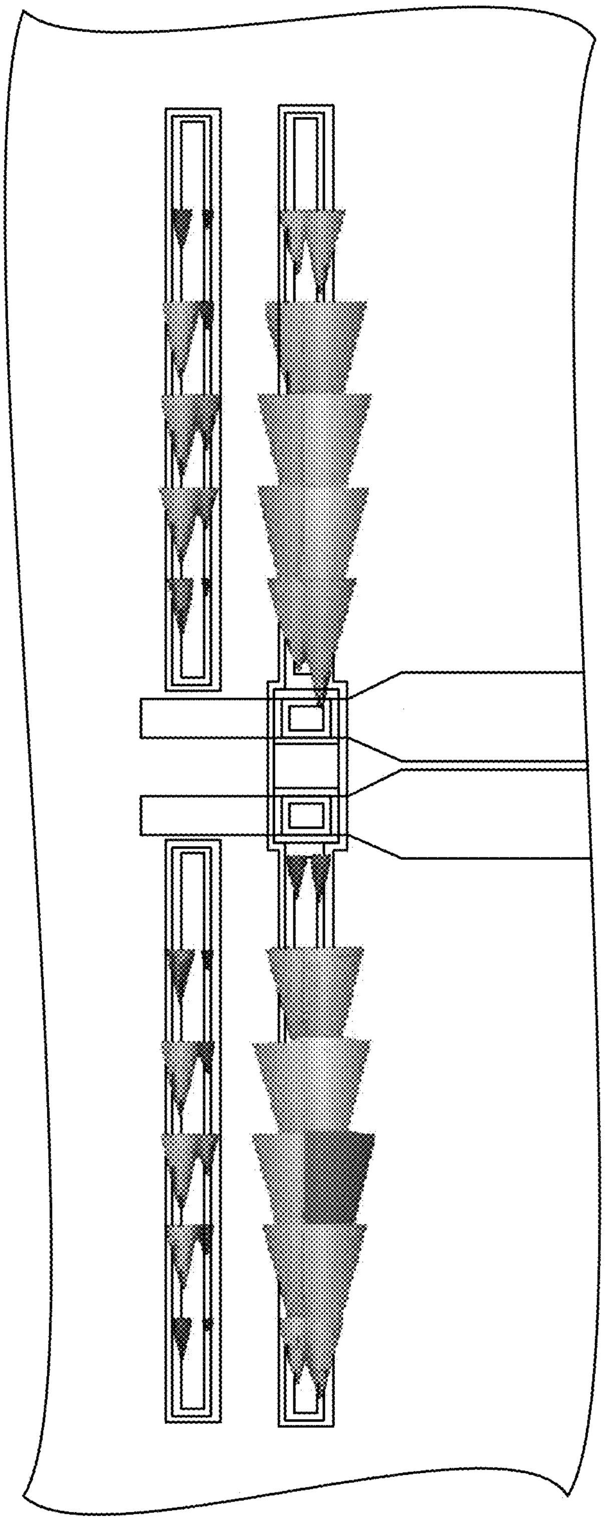
FIG. 10 shows a current distribution on an embodiment of a linearly polarized MEMS antenna with parasitic elements at 60 GHz.
Figure 11:
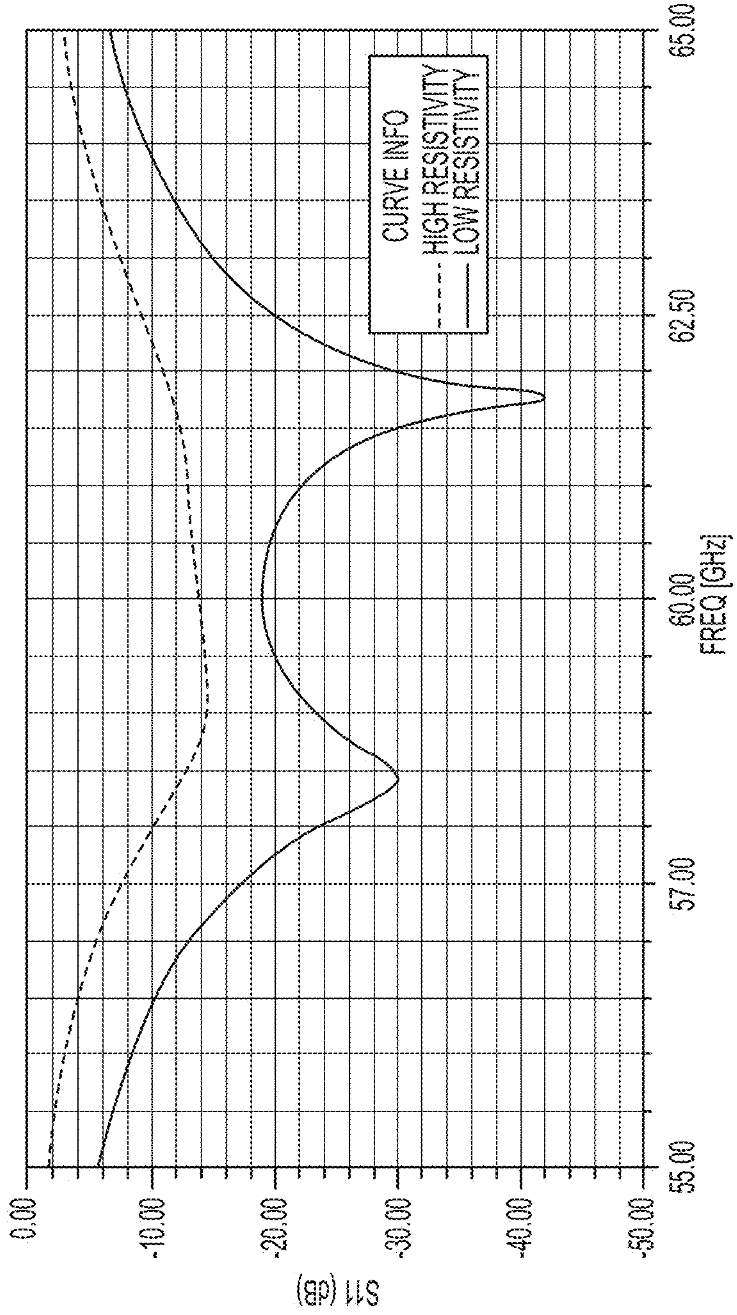
FIG. 11 shows a return loss versus frequency of an embodiment of a linearly polarized MEMS antenna with parasitic elements.
Figure 12B:
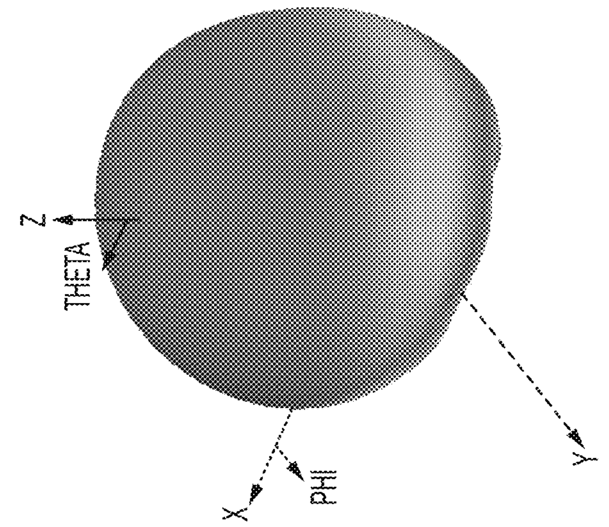
FIG. 12(*a*)-(*b*) show 3D radiation patterns of an embodiment of a linearly polarized MEMS antenna with parasitic elements at 60 GHz: (a) on high-resistivity silicon, and (b) on low-resistivity silicon.
Figure 12A:
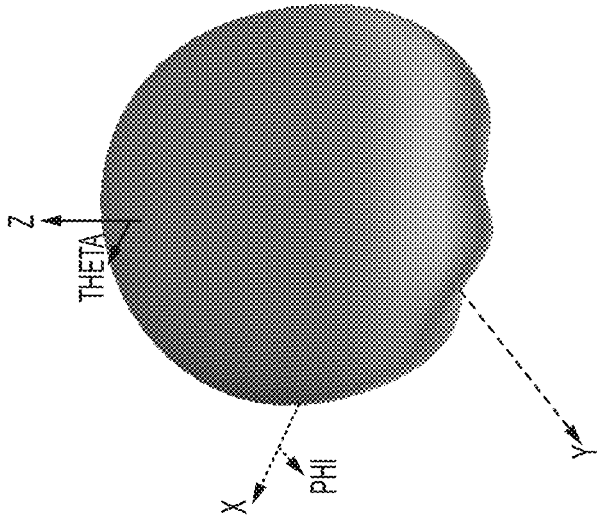
Figure 13:
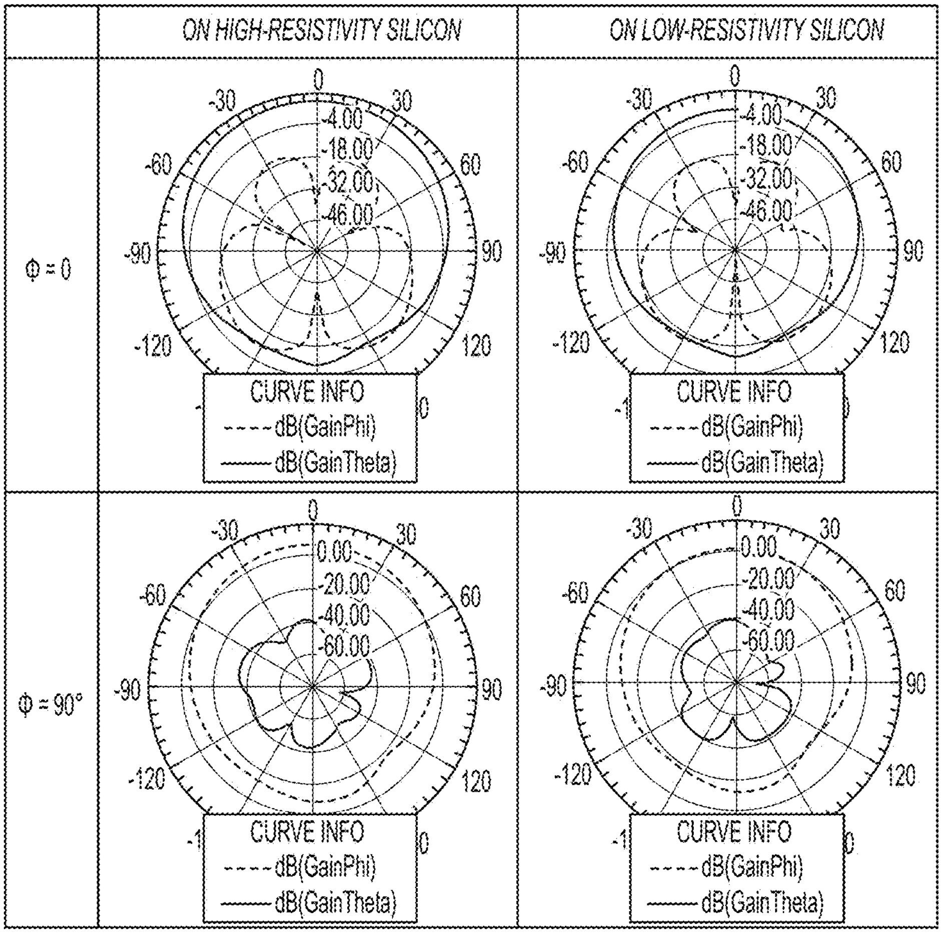
FIG. 13 shows radiation patterns in two orthogonal planes of an embodiment of a linearly polarized MEMS antenna with parasitic elements at 60 GHz.
Figure 14A:
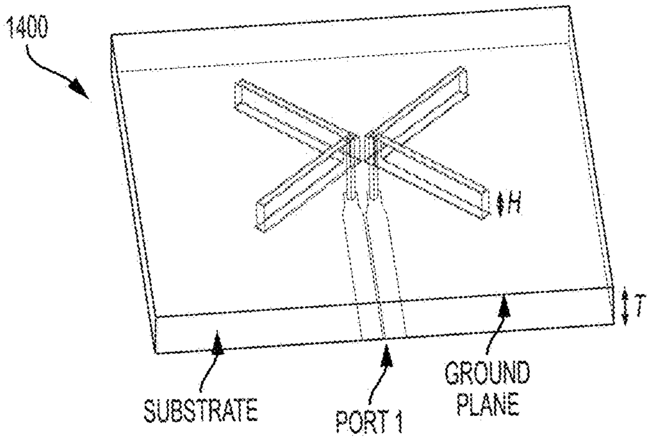
FIG. 14(*a*)-(*c*) show geometry of an embodiment of a circularly polarized MEMS antenn: (a) 3D zoom-out view, (b) 3D zoom-in view, and (c) top-view.
Figure 14B:
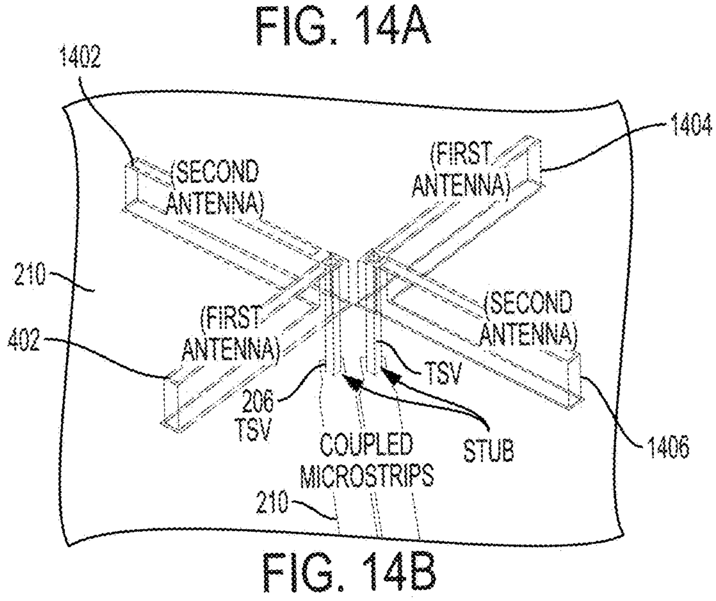
Figures 1, 14C:
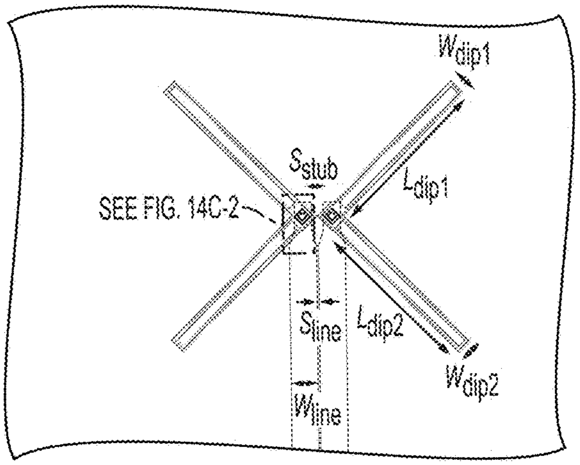
Figures 2, 14C:
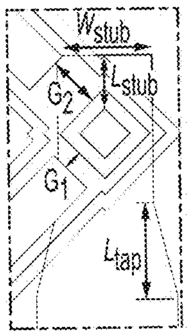

The bandwidth of an embodiment of a linearly polarized MEMS antenna 900 may be greatly enhanced by adding parasitic radiators 904, 906 beside the driven ones 402, 902, as shown in FIG. 9. By making the lengths of the parasitic radiators 904, 906 slightly less than the driven ones 402, 902, two overlapping resonances can be achieved, which enhances greatly the bandwidth of the antenna 900. The geometrical dimensions of an embodiment of a linearly polarized MEMS antenna with parasitic elements 900 are listed in Table IV. The current distribution on the radiating arms at 60 GHz for this embodiment is shown in FIG. 10. The return loss of an embodiment of a linearly polarized antenna with parasitic elements is plotted versus frequency in FIG. 11. Comparing this figure with FIG. 6, shows that the addition of parasitic elements 904, 906 may greatly enhance the impedance bandwidth of the antenna 900. The 3D and 2D radiation patterns of this antenna 900 are drawn in FIGS. 12 and 13, respectively. Table V lists the electric characteristics of an embodiment of this antenna 900 as fabricated on both high- and low-resistivity silicon.

TABLE IV

GEOMETRICAL PARAMETERS OF AN EMBODIMENT OF A LINEARLY POLARIZED MEMS ANTENNA WITH PARASITIC ELEMENTS

| Antenna Geometrical Parameters | On either High- or Low-Resistivity Silicon |
|---|---|
| H | 275 μm |
| T | 400 μm |
| $L_{driv}$ | 2.670 mm |
| $W_{driv}$ | 80 μm |
| $L_{para}$ | 2.650 mm |
| $W_{para}$ | 80 μm |
| G | 40 μm |
| $S_{elem}$ | 155 μm |
| $L_{tap}$ | 115 μm |
| $L_{stub}$ | 305 μm |
| $W_{stub}$ | 80 μm |
| $S_{stub}$ | 120 μm |

TABLE IV-continued

GEOMETRICAL PARAMETERS OF AN EMBODIMENT OF A LINEARLY POLARIZED MEMS ANTENNA WITH PARASITIC ELEMENTS

| Antenna Geometrical Parameters | On either High- or Low-Resistivity Silicon |
|---|---|
| $W_{line}$ | 180 μm |
| $S_{line}$ | 20 μm |

TABLE V

CHARACTERISTICS OF AN EMBODIMENT OF A LINEARLY POLARIZED MEMS ANTENNA WITH PARASITIC ELEMENTS

| Antenna Characteristics | On High-Resistivity Silicon | On Low-Resistivity Silicon |
|---|---|---|
| Impedance Bandwidth (−10 dB) | 4.30 GHz (7.16%) | 7.44 GHz (12.40%) |
| Directivity | 7.49 dBi | 7.56 dBi |
| Radiation Efficiency | 94.13% | 34.40% |
| Gain | 7.23 dBi | 2.92 dBi |
| Communication Range ($P_{Tx}$ = 100 dBm and $P_{Rx}$ = −70 dBm) | 21.03 m | 7.80 m |
| Cross-Polarization Level @ Broadside | −46.50 dB | −43.90 dB |
| Maximum Cross-polarization Level (φ = 0 plane) | −19.13 dB | −18.10 dB |
| Maximum Cross-Polarization Level (φ = 90° plane) | −40.70 dB | −43.20 dB |
| Front-to-Back Ratio | 17.70 dB | 17.17 dB |

FIG. 14 illustrates an embodiment of a MEMS antenna 1400 that includes four $\lambda_g/2$ radiating arms 402, 1402, 1404, 1406 mounted on top of narrow silicon walls 202 as illustrated in FIG. 2 above. Each set of two parallel arms (e.g., 402 and 1404) form one linearly polarized antenna like that described in FIG. 4. In one embodiment, a first linearly polarized antenna comprises arms 402 and 1404, and a second linearly polarized antenna may comprise arms 1402 and 1406. In one embodiment, the combination of the two linearly polarized antennas may radiate circularly polarized wave. For example, the two linearly polarized antennas may be oriented perpendicular to each other. In a particular embodiment, the phase shift between the currents on them is 90°.

In one embodiment, a gap may be placed between the horizontal and vertical arms of each antenna. The gap may be represented as a capacitor, whose capacitance can be controlled by the gap size. Therefore, having different gap sizes may result in different capacitances for the two antennas. For the same applied voltage difference on both antennas, the difference in capacitances may lead to phase shifts between the currents on the two antennas. By optimizing the gap sizes the required 90° phase shift may be been obtained. Table VI lists the dimensions of an embodiment of a circularly polarized antenna as fabricated on both high- and low-resistivity silicon according to the present embodiments.

TABLE VI

GEOMETRICAL PARAMETERS OF AN EMBODIMENT OF A CIRCULARLY POLARIZED MEMS ANTENNA

| Antenna Geometrical Parameters | On High-Resistivity Silicon | On Low-Resistivity Silicon |
|---|---|---|
| H | 275 μm | 275 μm |
| T | 400 μm | 400 μm |
| $L_{dip1}$ | 1.175 mm | 1.140 mm |
| $W_{dip1}$ | 90 μm | 110 μm |
| $L_{dip2}$ | 1.215 mm | 1.140 mm |
| $W_{dip2}$ | 90 μm | 110 μm |
| $G_1$ | 25 μm | 23 μm |
| $G_2$ | 65 μm | 65 μm |
| $L_{tap}$ | 115 μm | 115 μm |
| $L_{stub}$ | 61 μm | 55 μm |
| $W_{stub}$ | 120 μm | 120 μm |
| $S_{stub}$ | 80 μm | 80 μm |
| $W_{line}$ | 180 μm | 180 μm |
| $S_{line}$ | 20 μm | 20 μm |

Figure 15B:
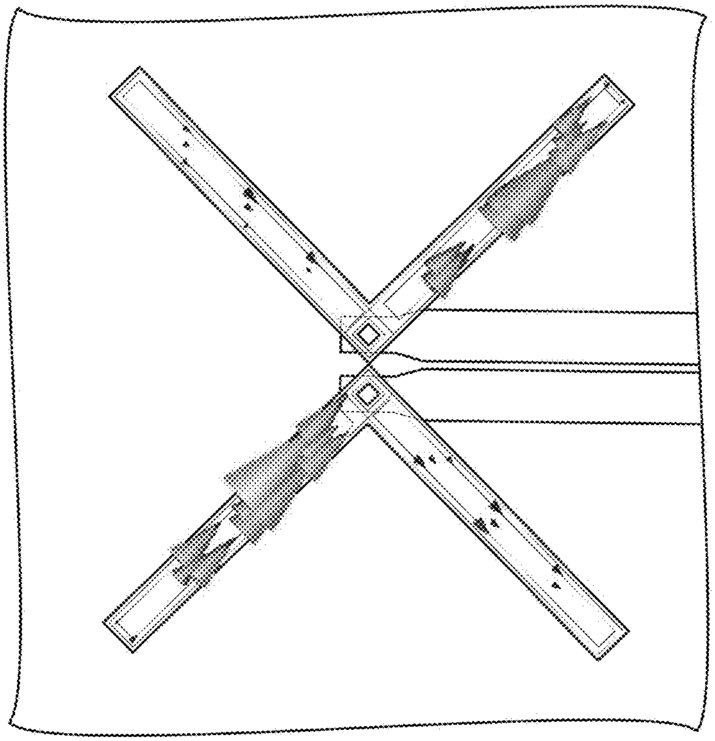
FIG. 15(*a*)-(*b*) show current distribution on the radiating arms of an embodiment of a circularly polarized MEMS antenna at 60 GHz: (a) t=0, and (b) t=T/4.
Figure 15A:
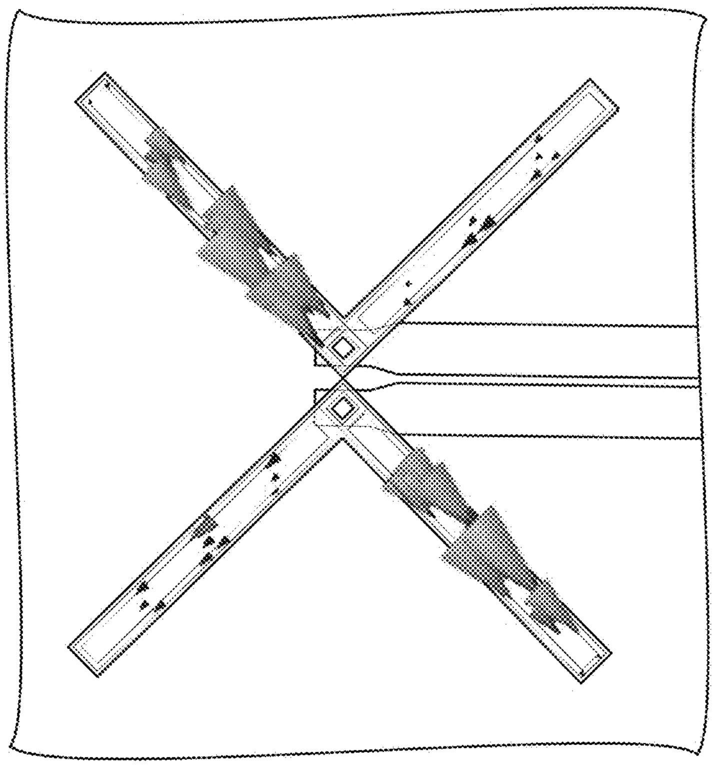
Figure 16A:
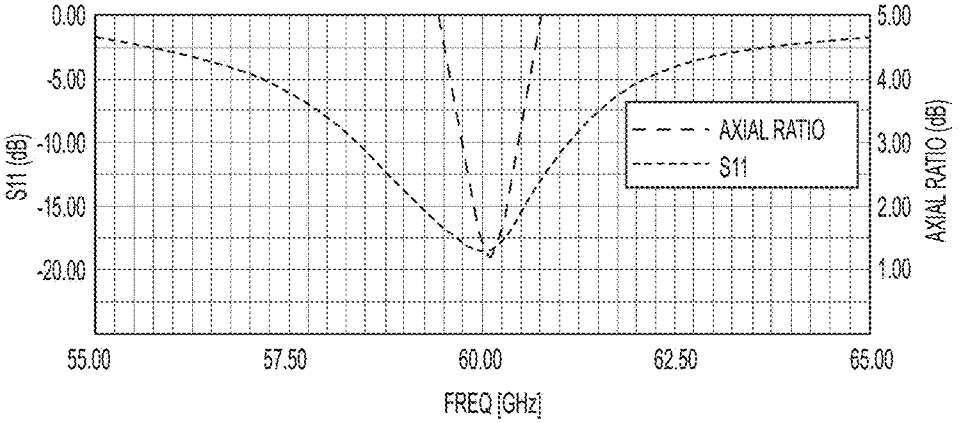
FIG. 16(*a*)-(*b*) show a return loss and axial ratio versus frequency of an embodiment of a circularly polarized MEMS antenna: (a) on high-resistivity silicon, and (b) on low-resistivity silicon.
Figure 16B:
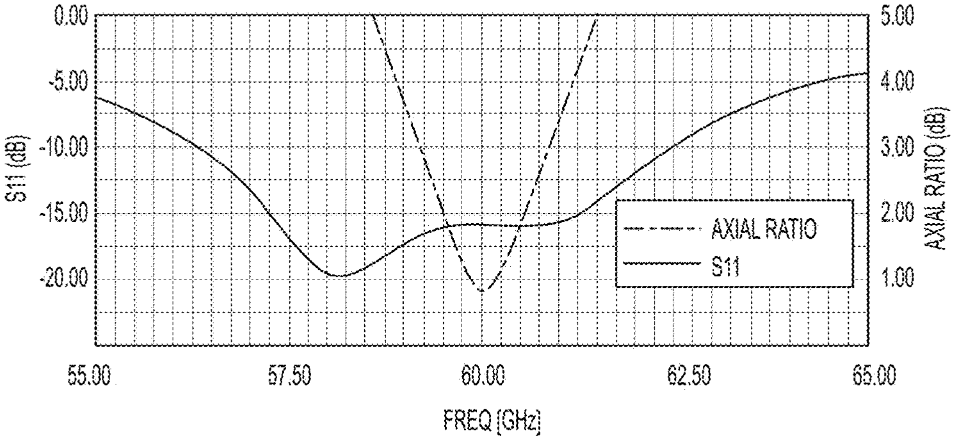
Figure 17B:
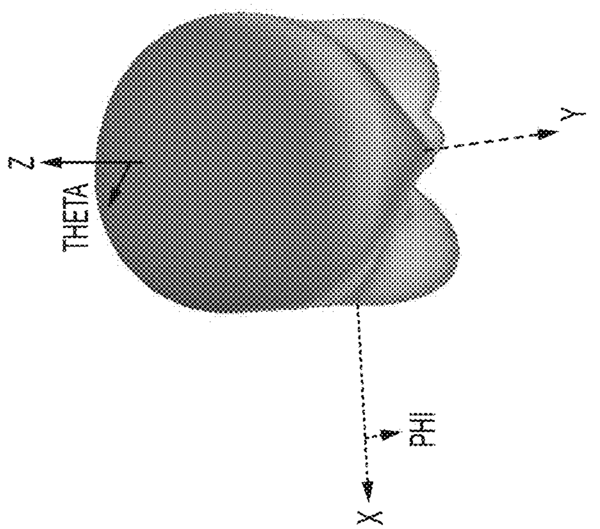
FIG. 17(*a*)-(*b*) show 3D radiation patterns of an embodiment of a circularly polarized MEMS antenna at 60 GHz: (a) on high-resistivity silicon, and (b) on low-resistivity silicon.
Figure 17A:
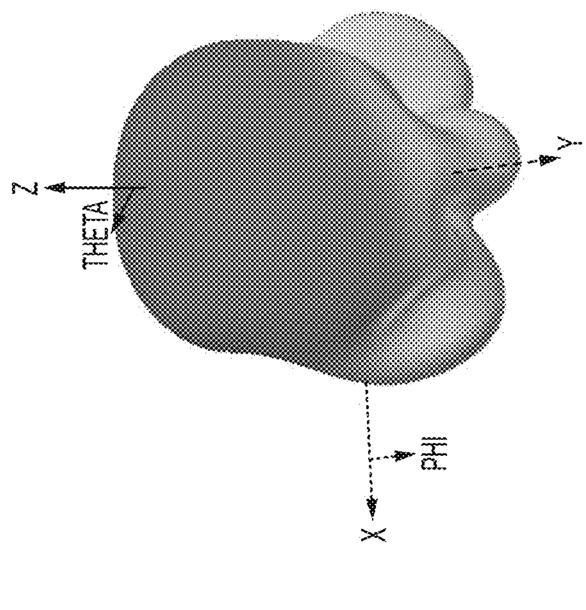
Figure 18:
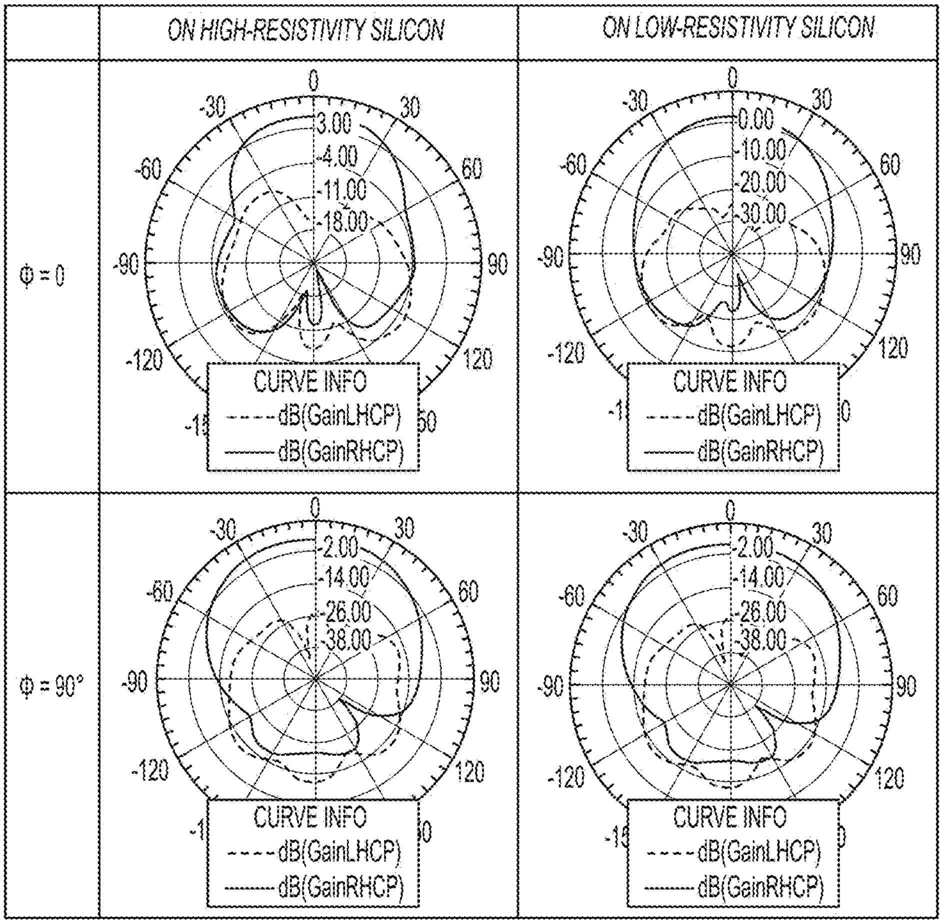
FIG. 18 shows radiation patterns in two orthogonal planes of an embodiment of a circularly polarized MEMS antenna at 60 GHz.
Figure 19A:
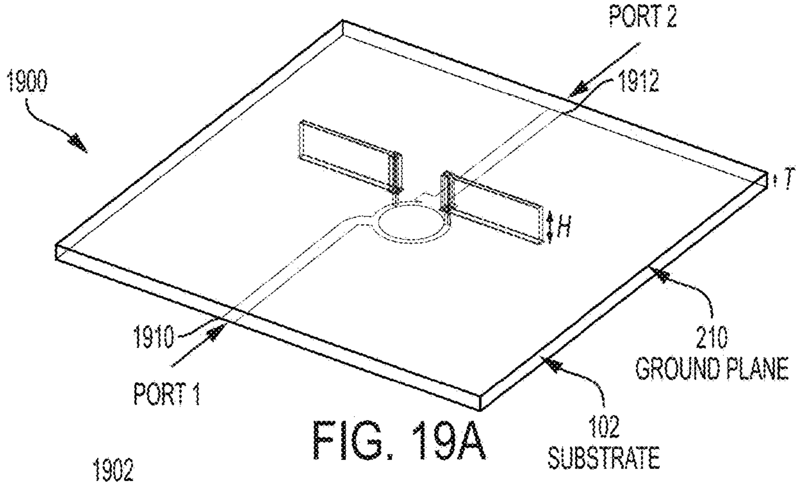
FIG. 19(*a*)-(*c*) show geometry of an embodiment of a reconfigurable MEMS dipole/monopole antenna: (a) 3D zoom-out view, (b) 3D zoom-in view, and (c) top-view.
Figure 19B:
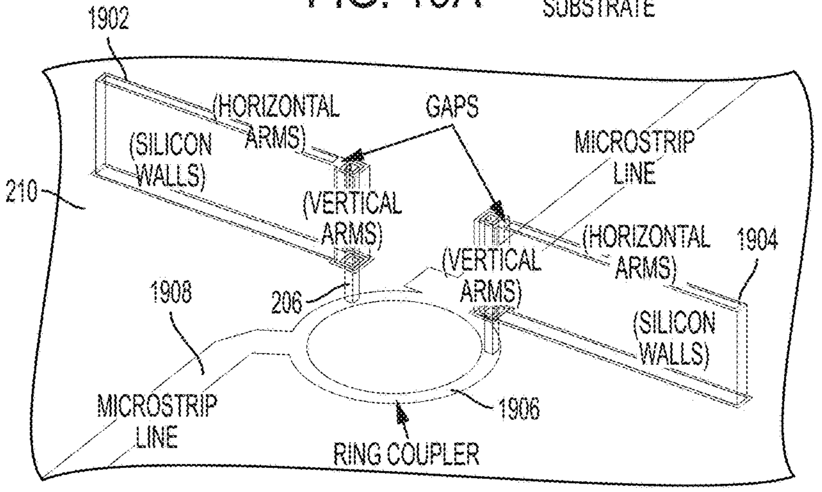
Figures 1, 19C:
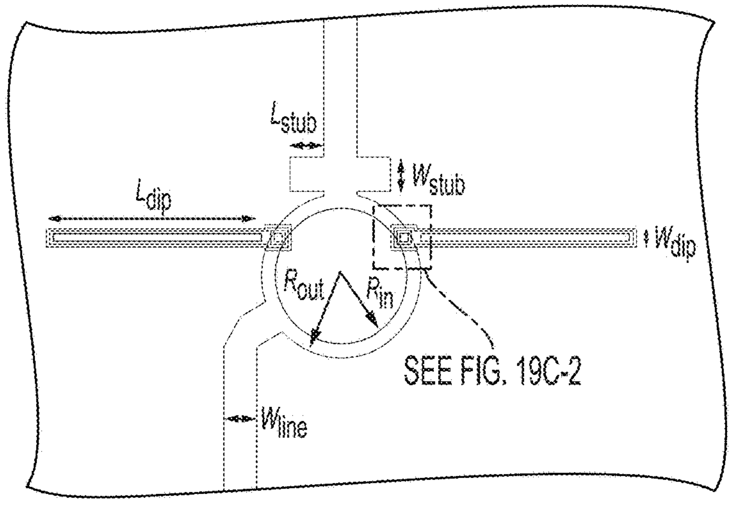
Figures 2, 19C:
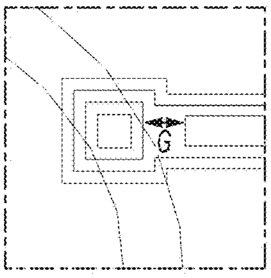

The current distribution at 60 GHz on the radiating arms of an embodiment of a circularly polarized antenna 1400 is plotted in FIG. 15 at two time instances that differ by quarter of a periodic time T. FIG. 15(*a*) shows that the radiating current at instant t=0 is that of the first antenna, while at t=T/4 the radiating current is that of the second antenna as shown in FIG. 15(*b*). This may result in a Right-Hand Circularly Polarized (RHCP) wave. FIG. 16 shows the axial ratio and return loss of an embodiment of a circularly polarized antenna 1400 fabricated on high- and low-resistivity silicon wafers. In both cases, reasonable overlapping between the axial ratio and impedance bandwidths can be observed. The 3D radiation pattern of an embodiment of a circularly polarized antenna 1400 is shown in FIG. 17. The radiation patterns in two orthogonal cuts are presented in FIG. 18 for both antenna versions. The electric characteristics of an embodiment of the circularly polarized antenna 1400 are summarized in Table VII.

TABLE VII

CHARACTERISTICS OF AN EMBODIMENT OF A CIRCULARLY POLARIZED MEMS ANTENNA

| Antenna Characteristics | On High-Resistivity Silicon | On Low-Resistivity Silicon |
|---|---|---|
| Impedance Bandwidth (−10 dB) | 2.68 GHz (4.45%) | 6.16 GHz (10.26%) |
| Axial Ratio Bandwidth (3 dB) | 0.74 GHz (1.22) | 1.7 GHz (2.83%) |
| Directivity | 6.38 dBi | 7.18 dBi |
| Radiation Efficiency | 93.70% | 31.95% |
| Gain | 6.10 dBi | 2.18 dBi |
| Communication Range ($P_{Tx}$ = 100 dBm and $P_{Rx}$ = −70 dBm) | 16.21 m | 6.57 m |
| Cross-Polarization Level @ Broadside | −21.40 dB | −26.40 dB |
| Maximum Cross-polarization Level (φ = 0 plane) | −8.68 dB | −11.25 dB |
| Maximum Cross-Polarization Level (φ = 90° plane) | −10.70 dB | −13.60 dB |
| Front-to-Back Ratio | 11.70 dB | 13.25 dB |

An embodiment of a reconfigurable MEMS antenna 1900 is shown in FIG. 19. This embodiment may include two arms 1902, 1904. Each arm 1902, 1904 may be fabricated using, for example, bulk micromachining through 675 μm thick high- or low-resistivity silicon wafers, and include narrow walls 202 as illustrated in FIG. 2. Two horizontal electromagnetic radiators may cover the top surfaces of the walls 202 as illustrated according to FIG. 2. Each arm 1902, 1904 may represent a half-wavelength dipole. Two vertical Through-Silicon Vias (TSVs 206) may be drilled or etched through the entire wafer. These TSVs 206 may represent the vertical arms of the antenna 1900. Two gaps may be inserted between the horizontal and vertical arms. These gaps help in achieving well-defined standing wave current patterns on the antenna's arms.

Figure 20A:
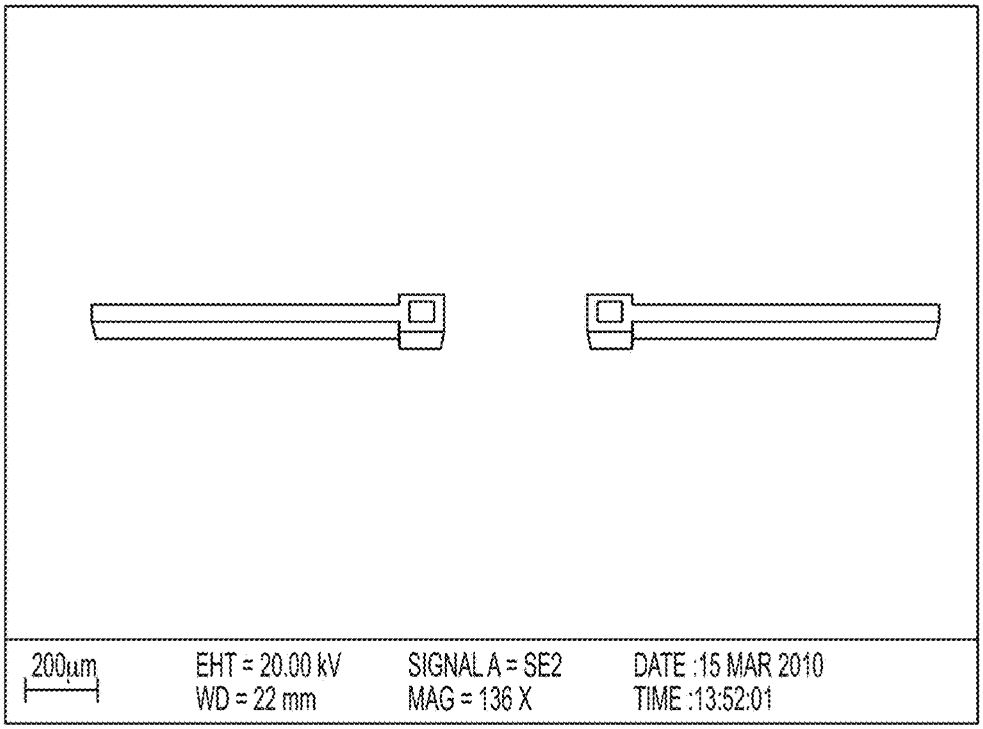
FIG. 20(*a*)-(*b*) shows photographs of a fabricated embodiment of a reconfigurable MEMS dipole/Monopole antenna: (a) top view, and (b) bottom view.
Figure 20B:
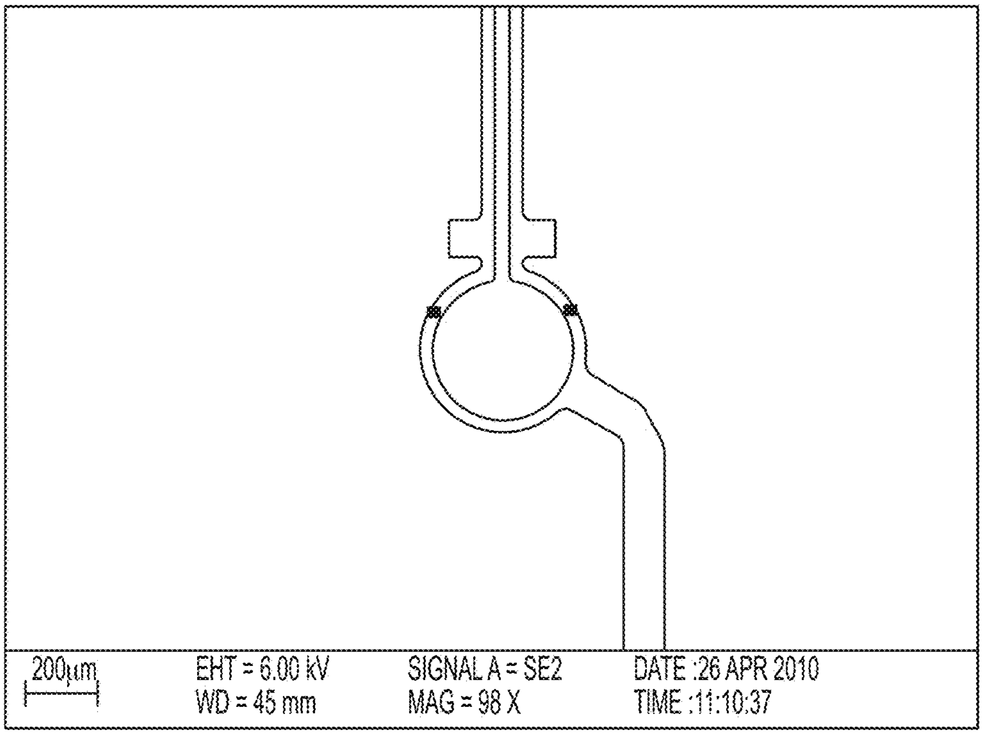

The top surface of the substrate may be covered with slotted ground plane 210, through which the silicon walls 202 are penetrating up. This plane 210 may isolates between the antenna 1900 and the bulk silicon substrate 102, which may reduce surface wave losses and increases radiation efficiency. Moreover, this ground plane 210 may reduce significantly the interference between the antenna 1900 and the driving circuit 108 that may be located below the substrate 102. In one embodiment, metallic parts of this structure are made of copper with thickness of 3 μm. One of ordinary skill in the art will recognize other thicknesses and materials suitable for use with the present embodiments. From the bottom side of the substrate 102, the TSVs 206 may be connected to the two output ports 1910, 1912 of a ring coupler 1906 made of microstrip lines. Two feeding microstrip lines 1908 may be connected to the input ports of the ring coupler 1906. The width of each line may be adjusted to have characteristic impedance of 50Ω at 60 GHz. In one embodiment, the ring may be made of a microstrip line whose width corresponds to a characteristic impedance of 70.7Ω. The radius of the ring 1906 may be adjusted such that its electric length equals $1.5\lambda_g$ at the frequency of operation. Geometrical parameters of one embodiment of this antenna 1900 are listed in Table VIII. The photographs of the fabricated prototype are presented in FIG. 20.

TABLE VIII

GEOMETRICAL PARAMETERS OF AN EMBODIMENT OF A RECONFIGURABLE MEMS DIPOLE/MONOPOLE ANTENNA

| Antenna Geometrical Parameters | On High-Resistivity Silicon | On Low-Resistivity Silicon |
|---|---|---|
| H | 475 μm | 475 μm |
| T | 200 μm | 200 μm |
| $L_{DIP}$ | 1.210 mm | 1.205 mm |
| $W_{DIP}$ | 70 μm | 70 μm |
| G | 55 μm | 55 μm |
| $R_{IN}$ | 384 μm | 384 μm |
| $R_{OUT}$ | 462 μm | 462 μm |
| $L_{STUB}$ | 200 μm | 150 μm |
| $W_{STUB}$ | 184 μm | 184 μm |
| $W_{LINE}$ | 184 μm | 184 μm |

Figure 21:
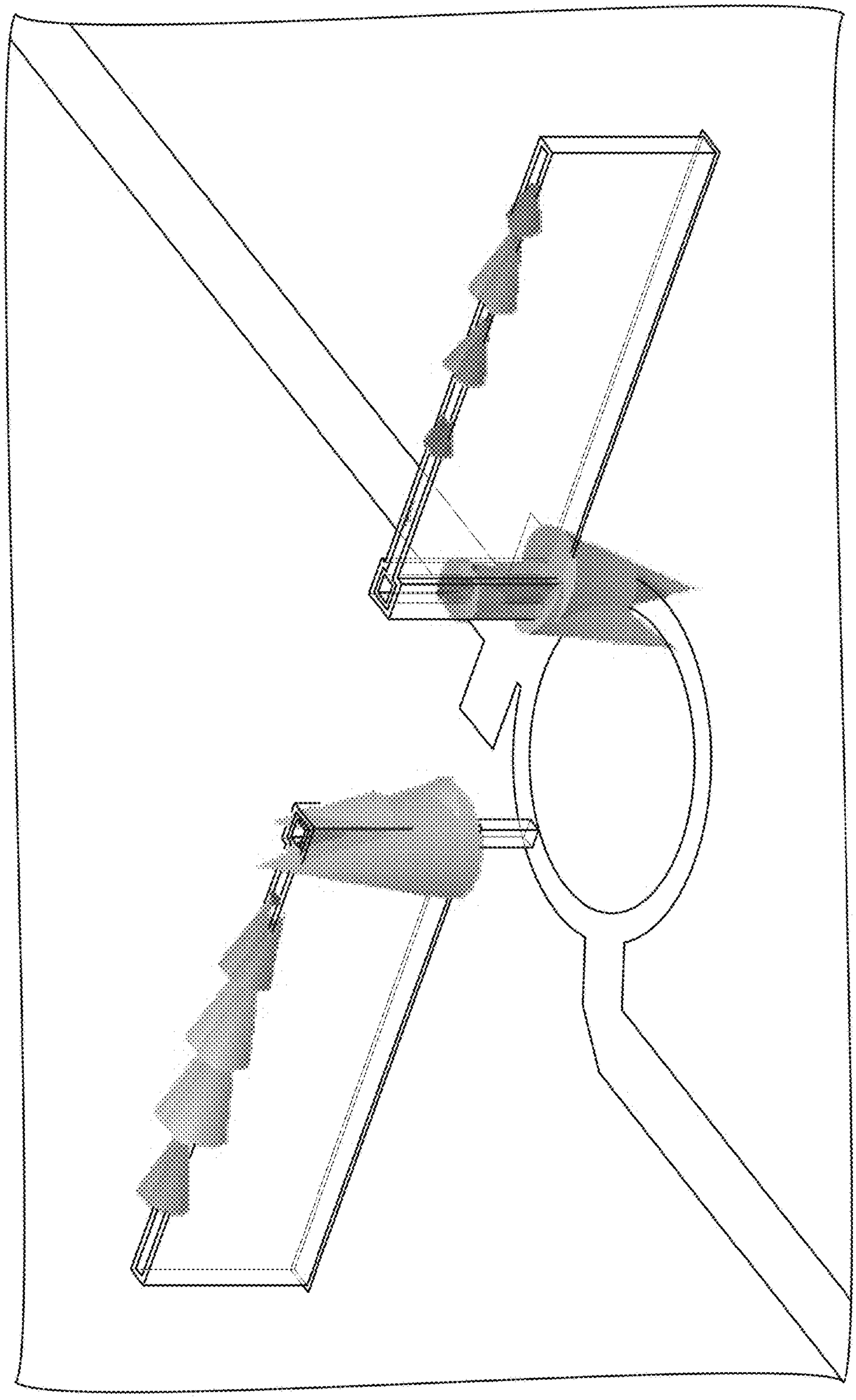
FIG. 21 shows a current distribution on arms of an embodiment of a reconfigurable MEMS dipole/Monopole antenna in the dipole mode at 60 GHz.

If an excitation signal is applied to the first port 1910 of the ring coupler 1906, see FIG. 19, the antenna vertical arms 1902, 1904 may be excited with the same amount of power, but with 180° phase shift. Almost no power will be transferred to the second port 1912. The currents on the vertical arms 206 may be opposite to each other, while on the horizontal arms 1902, 1904 the currents will be in the same direction. FIG. 21 shows the surface current distribution on an embodiment of antenna arms 1902, 1904 due to excitation from the first port 1910, as obtained using Ansoft/HFSS simulator at 60 GHz. In this mode of operation, the vertical currents may cancel out, while the horizontal arms 1902, 1904 act as an array of two half-wavelength dipoles. The presence of gaps between the vertical and horizontal arms imposes current nulls around the gaps. This defines standing waves on the horizontal arms, where each wave is terminated by two nulls separated by a distance of $\lambda_g/2$.

Figure 22:
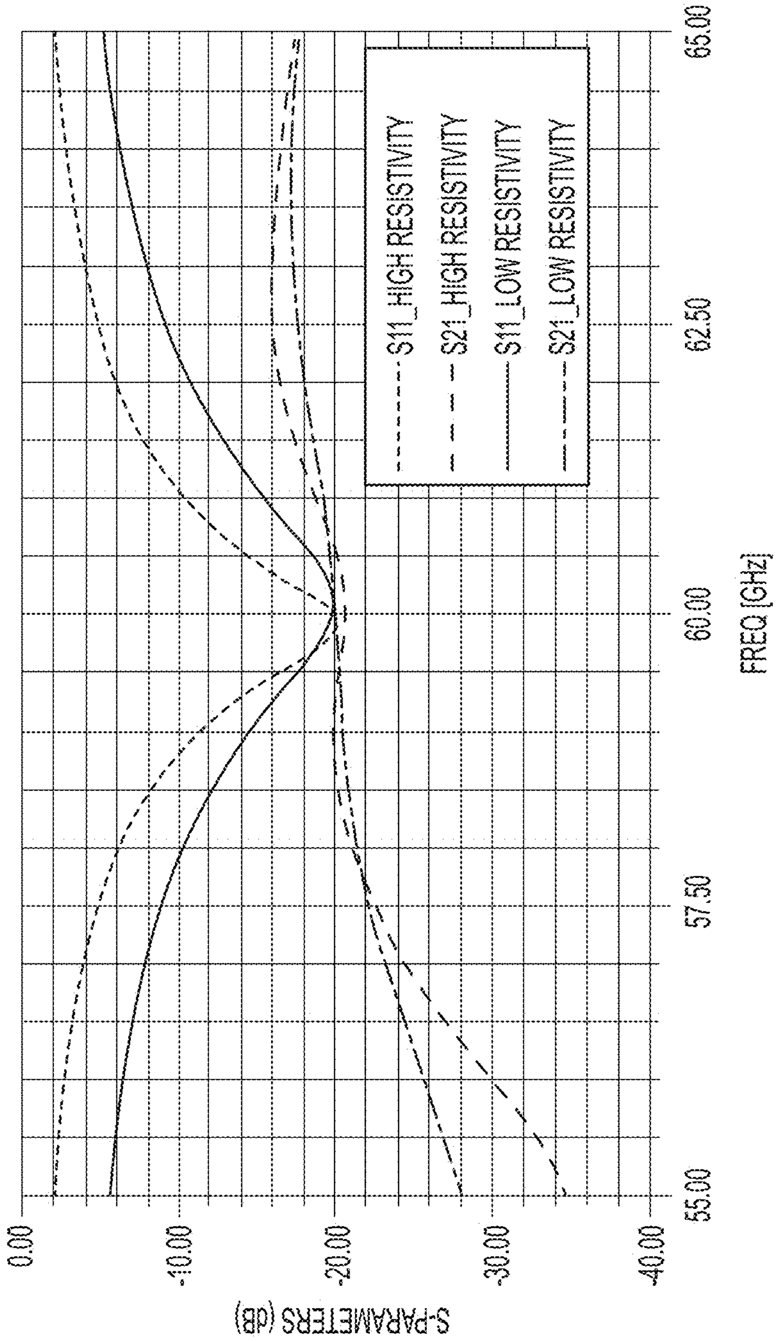
FIG. 22 shows S-parameters versus frequency of an embodiment of a reconfigurable MEMS dipole/Monopole antenna in the dipole mode of operation.
Figure 23A:
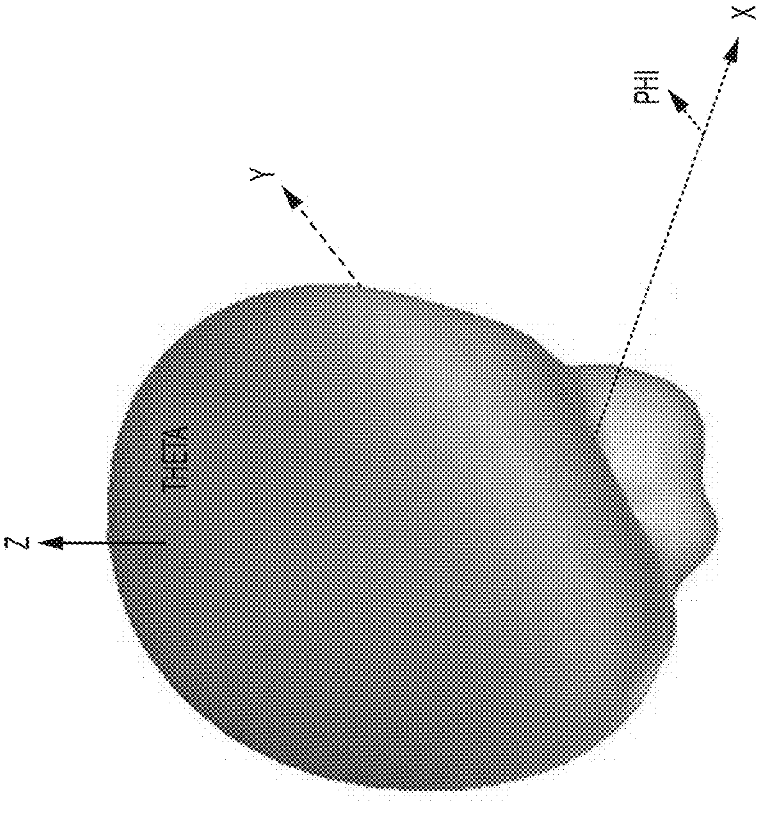
FIG. 23(*a*)-(*b*) show 3D radiation patterns of an embodiment of a reconfigurable MEMS dipole/Monopole antenna in the dipole mode at 60 GHz: (a) on high-resistivity silicon, and (b) on low-resistivity silicon.
Figure 23B:
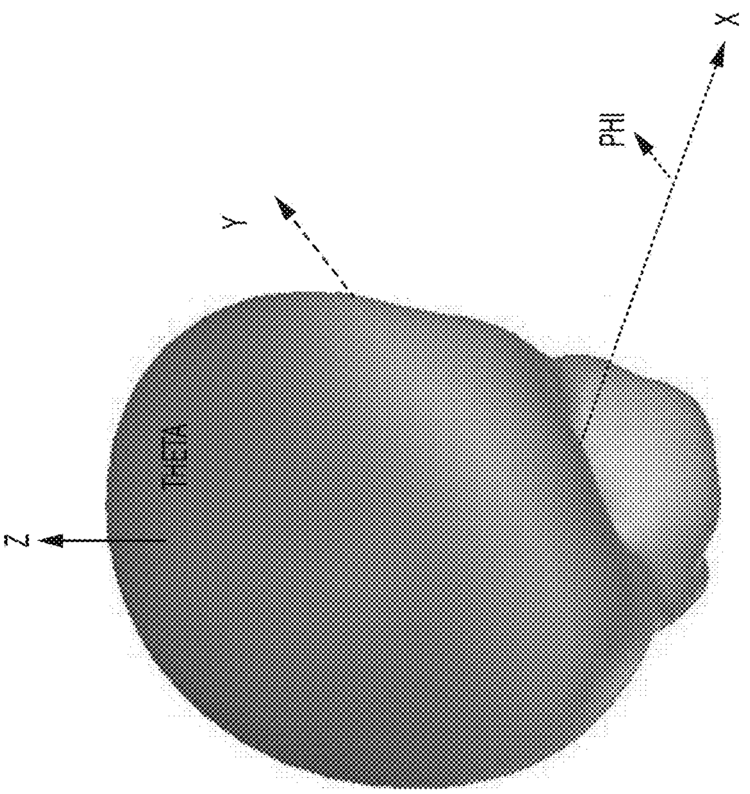
Figure 24:
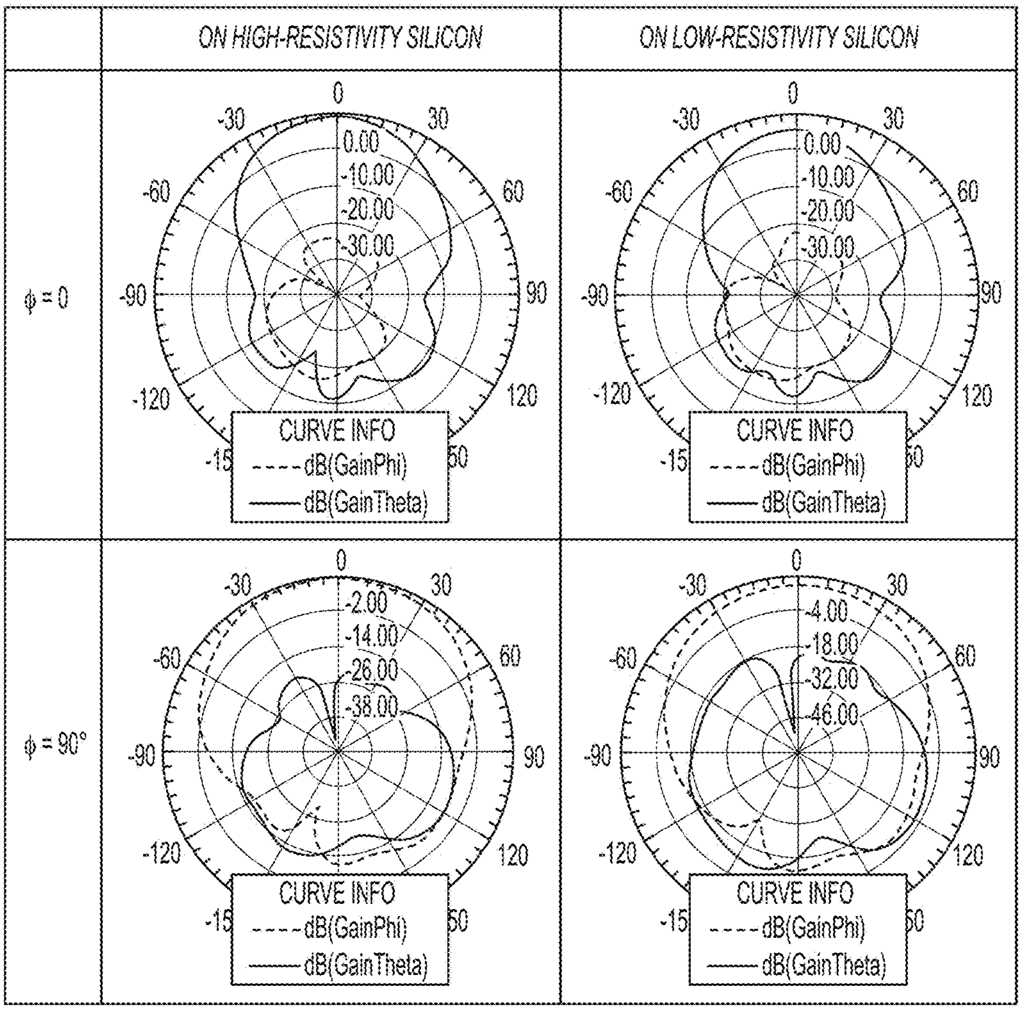
FIG. 24 shows radiation patterns in two orthogonal planes of an embodiment of a reconfigurable MEMS dipole/monopole antenna in the dipole mode at 60 GHz.

S-parameters of an embodiment of the antenna 1900 are plotted versus frequency in FIG. 22. In this mode, the antenna 1900 is excited via the first port 1910. The coupling to other port 1912, i.e. $S_{21}$, is less than −18 dB over the working frequency band, which indicates good isolation between the two ports. The 3D radiation pattern of the antenna 1900 in this mode of operation at 60 GHz is drawn in FIG. 23. It can be seen that this embodiment of the antenna 1900 is radiating mainly from the top side in the broadside direction, while the bottom side radiation is relatively weak and results mainly from diffraction at the truncated edges of the antenna structure. The radiation patterns in two orthogonal cuts for an embodiment of the antenna 1900 in the dipole mode, are shown in FIG. 24. The characteristics of the antenna 1900 in this mode of operation are summarized in Table IX.

TABLE IX

CHARACTERISTICS OF AN EMBODIMENT OF A RECONFIGURABLE MEMS DIPOLE/MONOPOLE ANTENNA IN A DIPOLE MODE OF OPERATION

| Antenna Characteristics | On High-Resistivity Silicon | On Low-Resistivity Silicon |
|---|---|---|
| Impedance Bandwidth (−10 dB) | 2.25 GHz (3.75%) | 4.30 GHz (7.16%) |
| Directivity | 9.40 dBi | 9.08 dBi |
| Radiation Efficiency | 95.15% | 45.7% |
| Gain | 9.14 dBi | 5.63 dBi |
| Communication Range ($P_{Tx}$ = 100 dBm and $P_{Rx}$ = −70 dBm) | 32.65 m | 14.55 m |
| Cross-Polarization Level @ Broadside | −33.90 dB | −27.90 dB |
| Maximum Cross-polarization Level (φ = 0 plane) | −24.90 dB | −21.50 dB |
| Maximum Cross-Polarization Level (φ = 90° Plane) | −17.55 dB | −12.60 dB |
| Front-to-Back Ratio | 19.60 dB | 16.82 dB |

Figure 25:
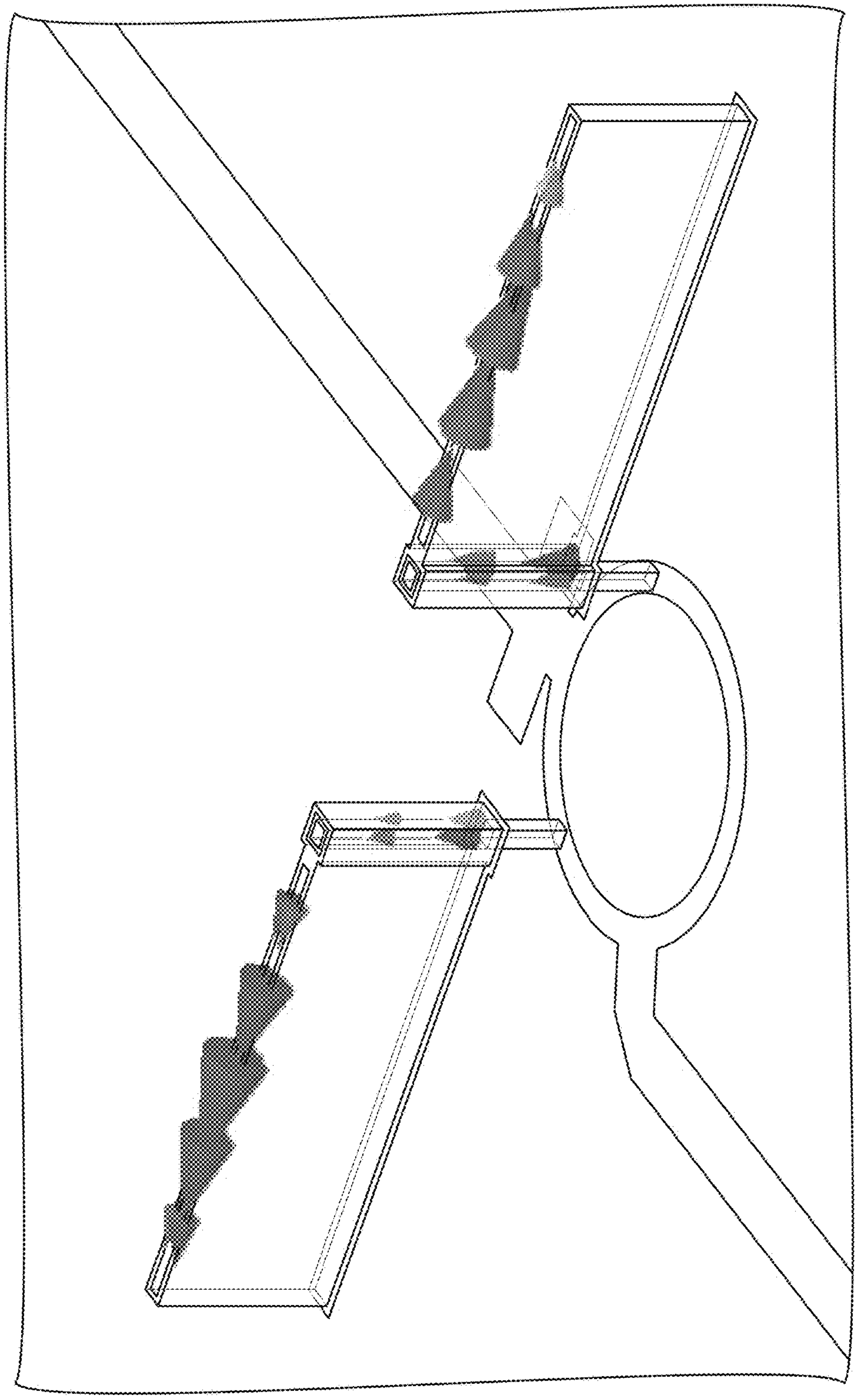
FIG. 25 shows a current distribution on the arms of an embodiment of a reconfigurable MEMS dipole/Monopole antenna in the monopole mode at 60 GHz.

The excitation of the monopole mode is via the second port 1912. In this case, the ring coupler 1906 delivers half of the input power to each antenna side 1902, 1904 with the same phase. A negligible amount of power can couple to the first port 1910. The surface current distribution of an embodiment of monopole mode on the antenna arms 1902, 1904 at 60 GHz is plotted in FIG. 25. It can be seen that the horizontal currents are opposite to each other, which results in relatively weak radiation from them. On the other hand, the vertical currents are in the same direction. Hence, the antenna 1900 in this mode of operation can be looked at as an array of two vertical monopoles. As in the dipole mode, the disconnection of the vertical and horizontal arms imposes current nulls at the points of disconnection. This ensures standing wave patterns terminated by these currents nulls. To enhance the matching between the antenna input impedance of the monopole mode and the feeding line, two open circuit stubs are connected in parallel with the microstrip line of port 2, as shown in FIG. 19.

Figure 26:
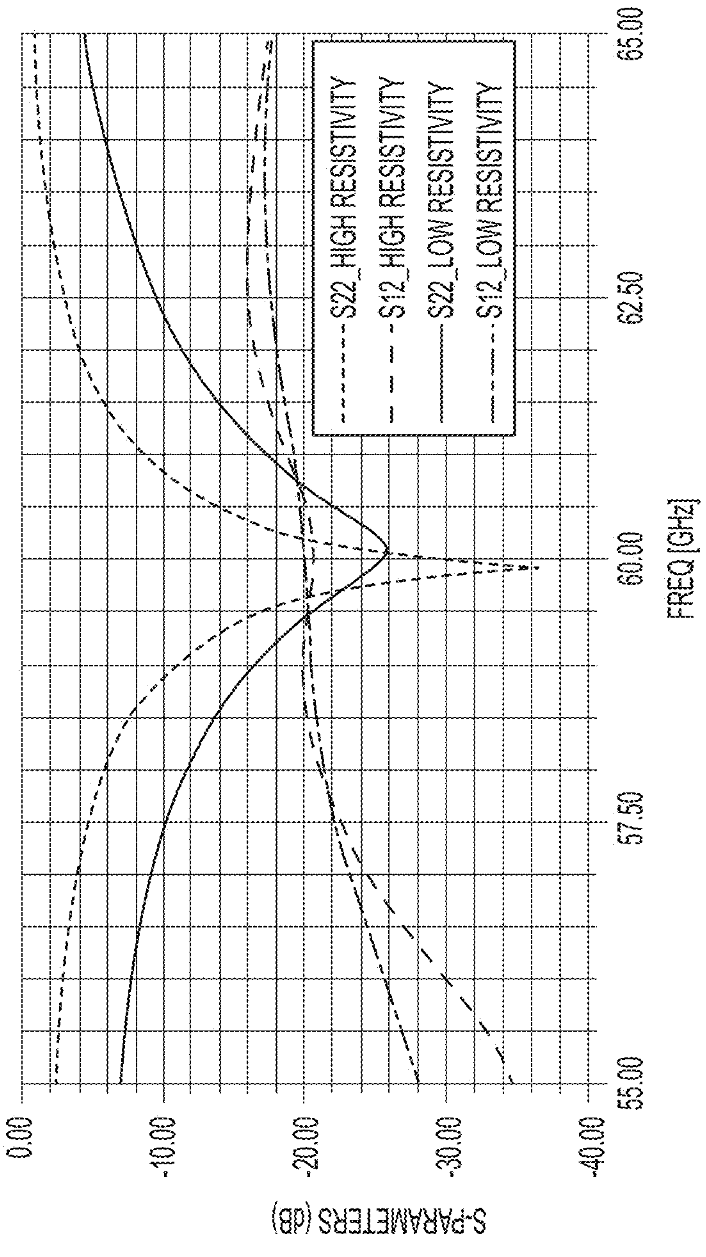
FIG. 26 shows S-parameters versus frequency of an embodiment of a reconfigurable MEMS dipole/Monopole antenna in the monopole mode.
Figure 27A:
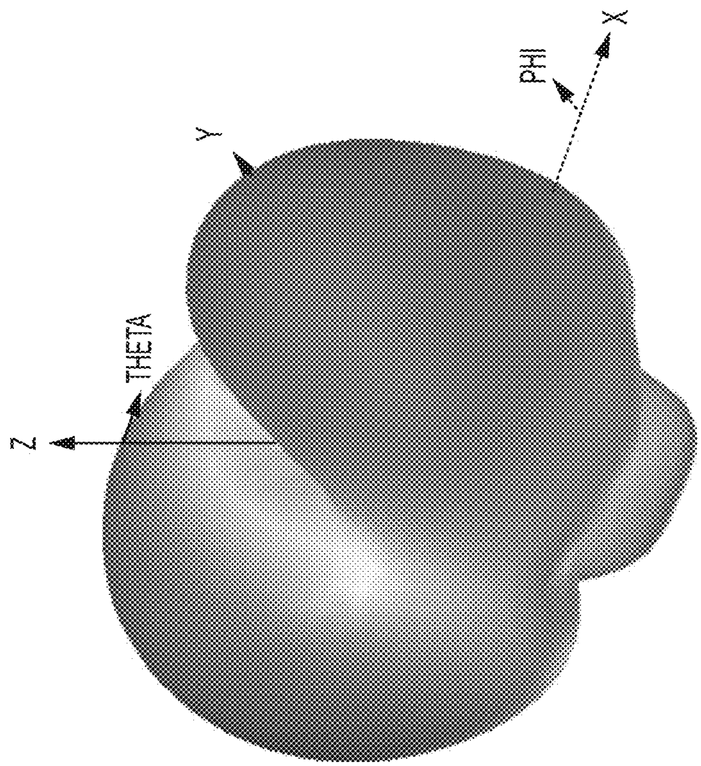
FIG. 27(*a*)-(*b*) show 3D radiation patterns of an embodiment of a reconfigurable MEMS dipole/Monopole antenna in the monopole mode at 60 GHz: (a) on high-resistivity silicon, and (b) on low-resistivity silicon.
Figure 27B:
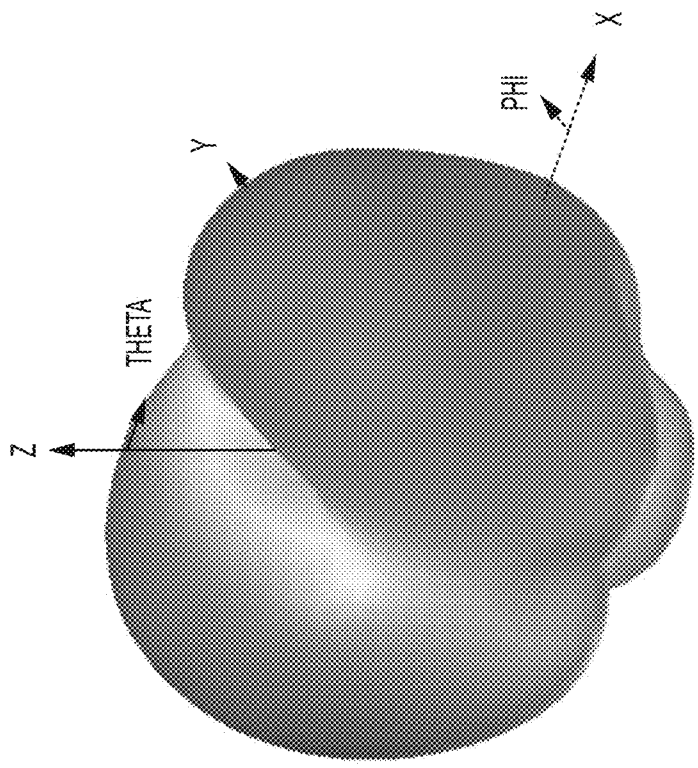
Figure 28:
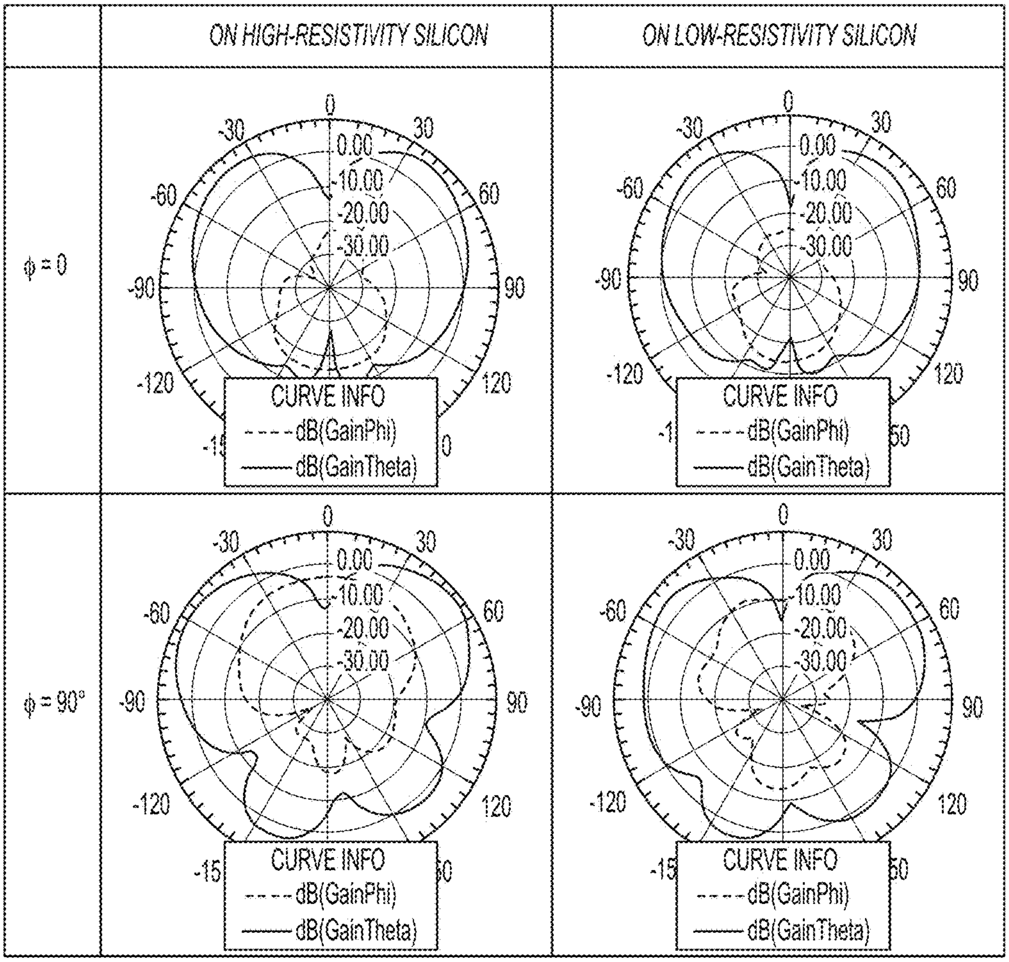
FIG. 28 shows radiation patterns in two orthogonal planes of an embodiment of a reconfigurable MEMS dipole/monopole antenna in the monopole mode at 60 GHz.

FIG. 26 shows the S-parameters that correspond to the monopole mode of operation, namely $S_{12}$ and $S_{22}$. Good matching can be observed at 60 GHz. Again, the coupling between the two ports is very weak as indicated by $S_{12}=S_{21}<-18$ dB over the working bandwidth. The 3D and 2D radiation pattern at 60 GHz of the antenna in the monopole mode of operation are shown in FIGS. 24 and 28, respectively. A radiation null at the broadside direction can be noticed. Unlike the radiation pattern of the dipole mode, this pattern offers better coverage around the end-fire direction. Switching between the two modes of excitation provides very good coverage for the entire half-space. Table X summarizes the characteristics of an embodiment of a reconfigurable antenna in its monopole mode of operation.

TABLE X

Characteristics of an Embodiment of a Reconfigurable MEMS Dipole/Monopole Antenna in a Monopole Mode of Operation

| Antenna Characteristics | On High-Resistivity Silicon | On Low-Resistivity Silicon |
|---|---|---|
| Impedance Bandwidth (−10 dB) | 1.93 GHz (3.21%) | 4.94 GHz (8.23%) |
| Directivity | 6.94 dBi | 6.92 dBi |
| Radiation Efficiency | 95.40% | 49.50% |
| Gain | 6.70 dBi | 3.83 dBi |
| Communication Range ($P_{Tx}$ = 100 dBm and $P_{Rx}$ = −70 dBm) | 18.62 m | 9.61 m |
| Cross-Polarization Level @ End-fire (φ = 0 plane) | −25.90 dB | −31.30 dB |
| Cross-Polarization Level @ End-fire (φ = 90° plane) | −17.40 dB | −30.70 dB |

Figure 29A:
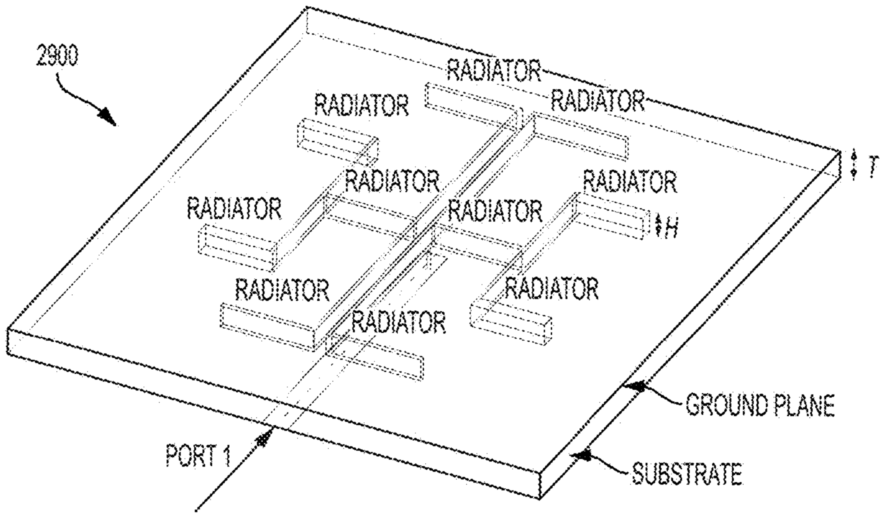
FIG. 29(*a*)-(*b*) show geometry of an embodiment of a wire-grid MEMS antenna array: (a) 3D view, and (b) top-view.
Figures 1, 29B:
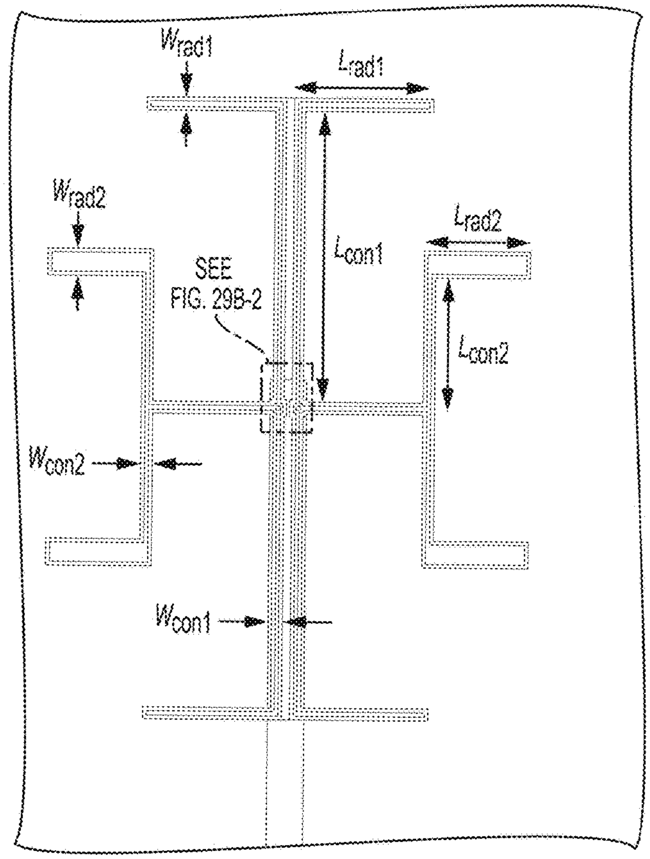
Figures 2, 29B:
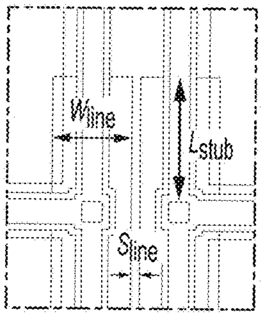

An embodiment of a wire-grid array 2900 is shown in FIG. 29. This embodiment may include number of arms that are defined by deep reactive ion etching of silicon wafer with thickness of 675 μm. Each arm may include the structure and be formed by substantially the same process as the arms described in FIGS. 2-4. For example, the arms may include narrow walls 202. The top faces of these walls 202 may be covered with metal strips, which form the radiators 204 and connectors, as shown in FIG. 29. The electric length of all radiators 204 may be $\lambda_g/2$. Two vertical TSVs 206 with square cross-section may be drilled or etched through the entire wafer 102 and penetrate both the substrate 102 and the walls 202. The top surface of the substrate 120 may be covered with slotted ground plane 210, through which the silicon walls 202 project. This plane 210 may isolate between the antenna 2900 and the bulk silicon substrate 102, which reduces surface wave losses and increases the radiation efficiency. Moreover, the presence of this plane 210 may result in reducing significantly the interference between the antenna 2900 and the feeding circuit 108 that is located below the ground plane 210. From the bottom side of the substrate 102, the TSVs 206 may be connected to the two strips of a coupled microstrips feeding line. This line is fed with its differential mode, whose characteristic impedance is 50Ω. An open circuit stubs is connected in parallel with the antenna array in order to enhance the impedance matching. Dimensions of one embodiment of a wire-grid array are listed in Table XI.

TABLE XI

GEOMETRICAL PARAMETERS OF AN EMBODIMENT OF A WIRE-GRID MEMS ANTENNA ARRAY

| Antenna Geometrical Parameters | On either High- or Low-Resistivity Silicon |
|---|---|
| H | 275 μm |
| T | 400 μm |
| $L_{rad1}$ | 1.440 mm |
| $W_{rad1}$ | 88 μm |
| $L_{rad2}$ | 1.090 mm |
| $W_{rad2}$ | 230 μm |
| $L_{con1}$ | 3.140 mm |
| $W_{con1}$ | 81 μm |
| $L_{con2}$ | 1.415 mm |
| $W_{con2}$ | 81 μm |
| $L_{stub}$ | 275 μm |
| $W_{line}$ | 180 μm |
| $S_{line}$ | 20 μm |

Figure 30:
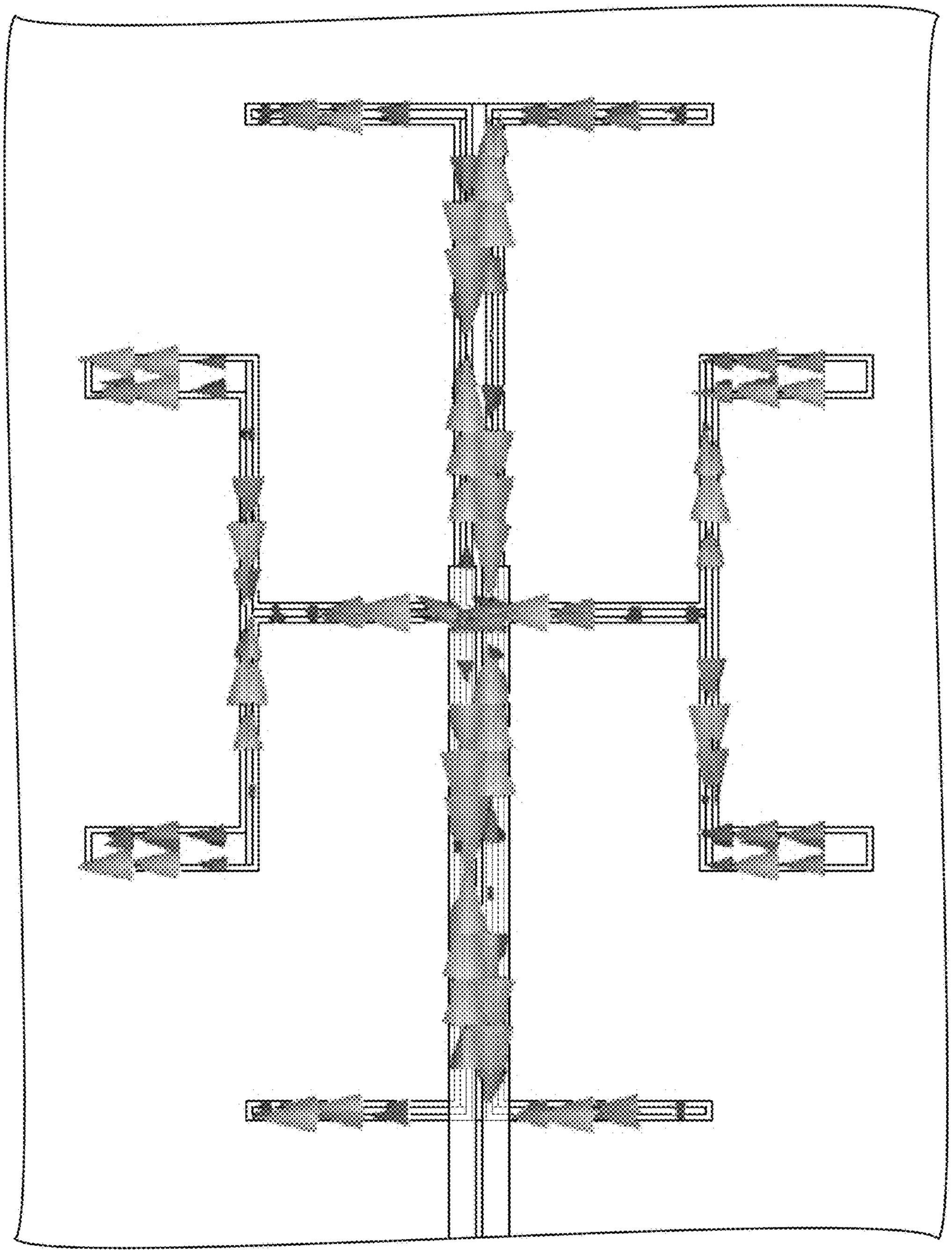
FIG. 30 shows current distribution on the radiators 204 and connectors of an embodiment of a wire-grid MEMS antenna array at 60 GHz'
Figure 31:
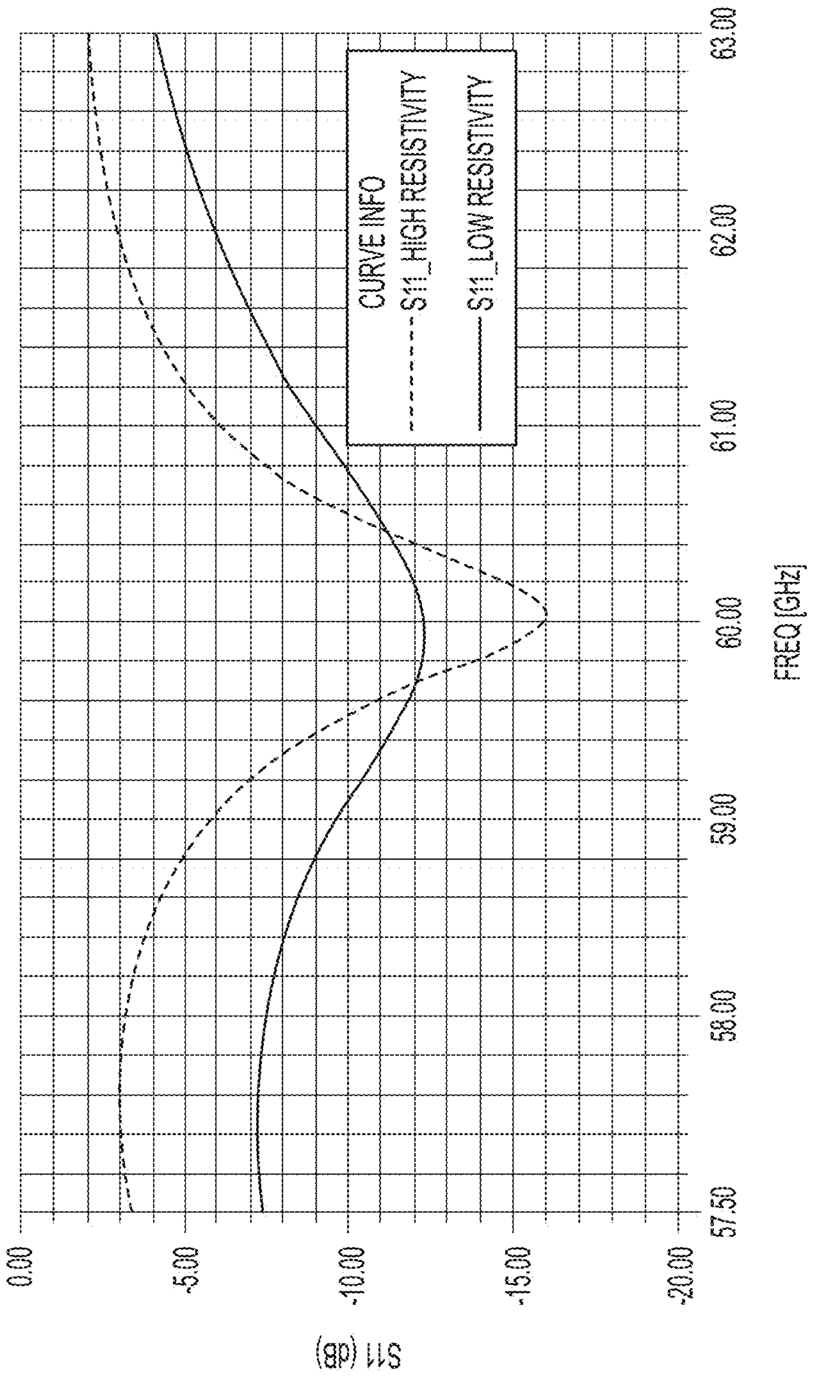
FIG. 31 shows return loss versus frequency of an embodiment of a wire-grid MEMS antenna array.
Figure 32A:
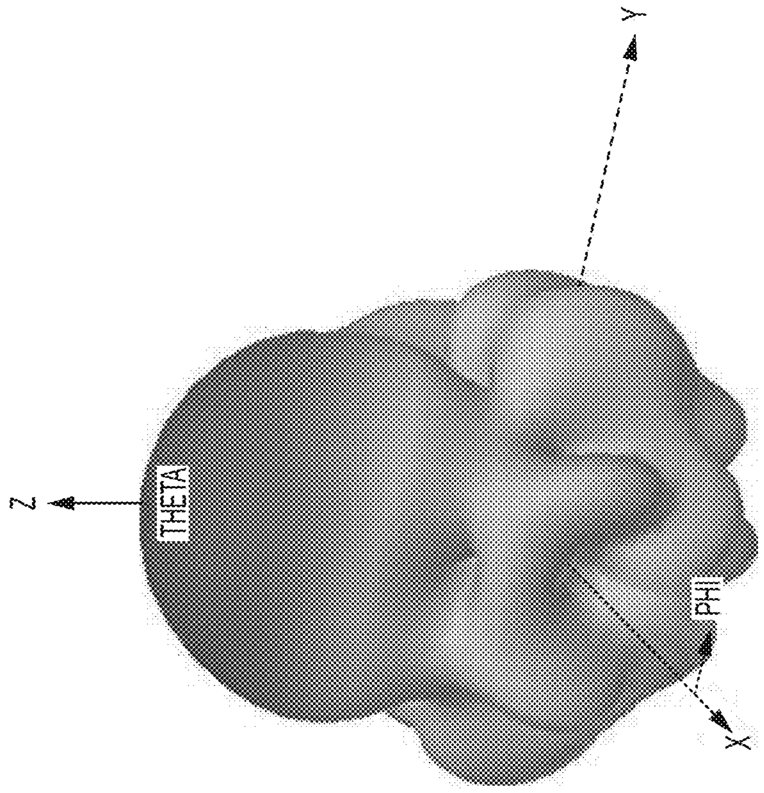
FIG. 32(*a*)-(*b*) show 3D radiation patterns of an embodiment of a wire-grid MEMS antenna array at 60 GHz: (a) on high-resistivity silicon, and (b) on low-resistivity silicon.
Figure 32B:
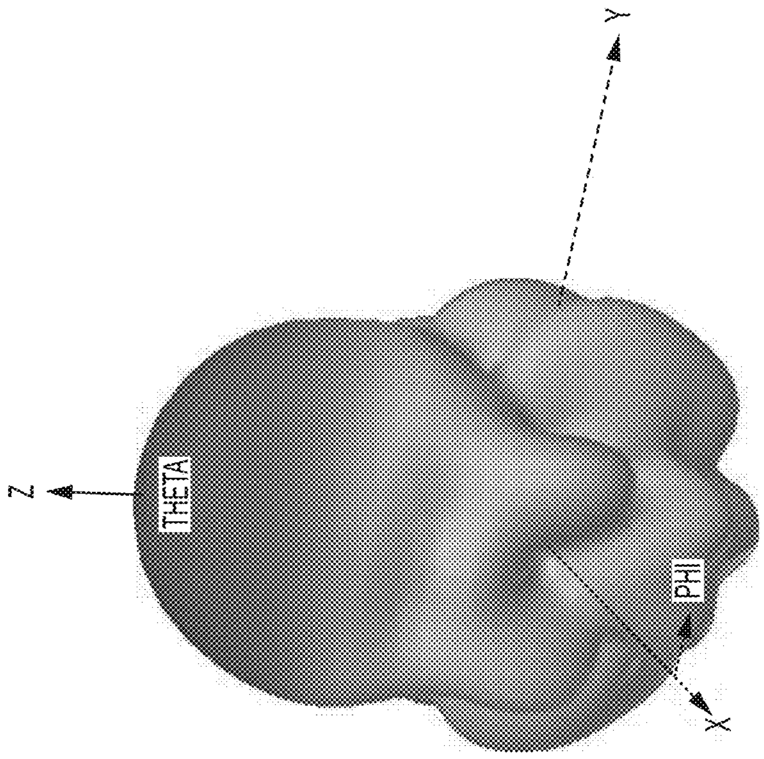
Figure 33:
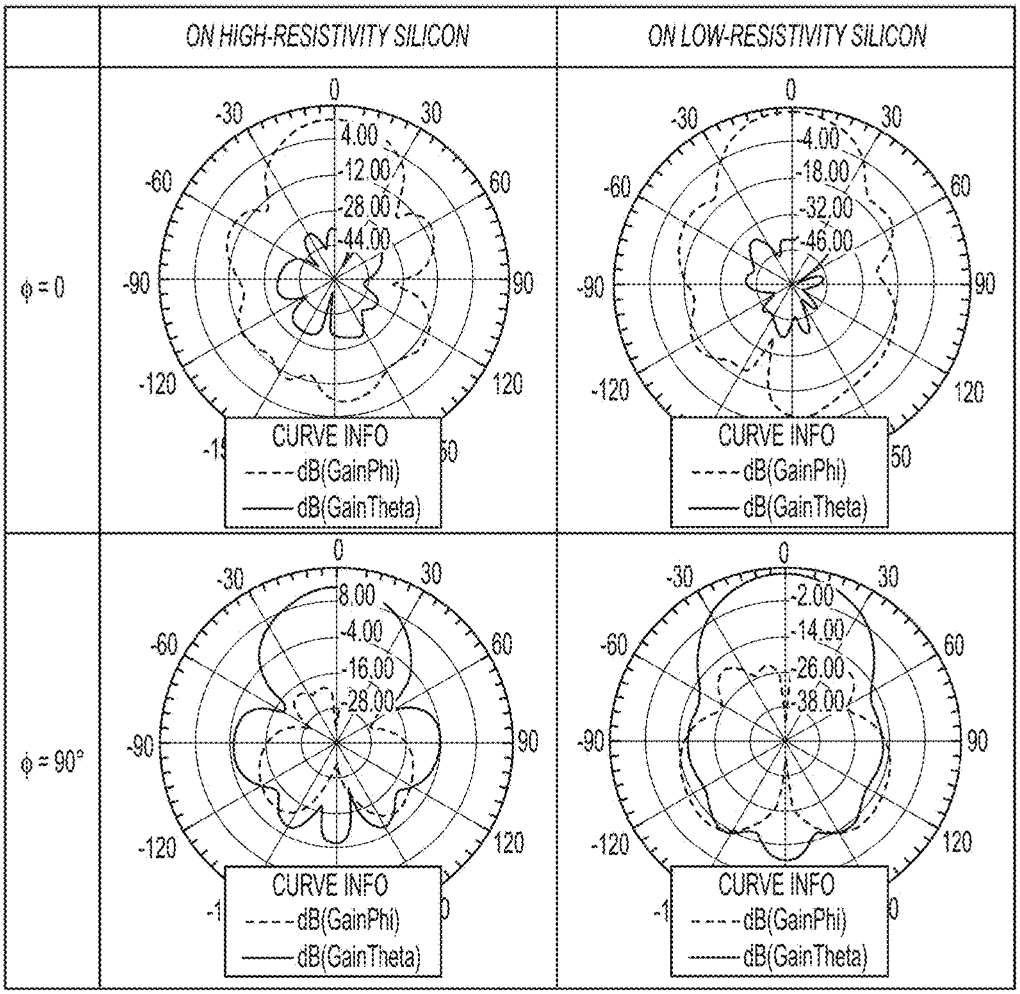
FIG. 33 shows radiation patterns in two orthogonal planes of an embodiment of a wire-grid MEMS antenna array at 60 GHz.

FIG. 30 shows the current distribution on the antenna's 2900 radiators 204 and connectors as obtained using Ansoft/HFSS at 60 GHz. The electrical lengths of the radiators 204 and connectors are adjusted such that the currents on the radiators 204 are in the same direction, while the currents on the connectors are opposite to each other, as shown in FIG. 30. Consequently, this embodiment of a wire-grid antenna 2900 structure can be considered as an array of 10 radiating dipoles. The return losses of this embodiment of the wire-grid array 2900 on both high- and low-resistivity silicon are plotted versus frequency in FIG. 31. Both versions are resonating at 60 GHz as required. The bandwidth of an embodiment of the wire-grid array 2900 on low-resistivity silicon is wider than that on high-resistivity due to the increased losses in the former case. The 3D radiation patterns of the wire-grid array 2900 on both high- and low-resistivity silicon are presented in FIG. 32. Symmetric top-side radiation patterns can be noticed. Two orthogonal cuts in these patterns are shown in FIG. 33. It can be seen that the cross-polarization level in both cuts is extremely low due to the perfect cancellation of the unwanted currents on the connectors. A summary of the electric characteristics of an embodiment of a wire-grid array 2900 on both high- and low-resistivity silicon is listed in Table XII.

TABLE XII

CHARACTERISTICS OF AN EMBODIMENT OF A WIRE-GRID MEMS ANTENNA ARRAY

| Antenna Characteristics | On High-Resistivity Silicon | On Low-Resistivity Silicon |
|---|---|---|
| Impedance Bandwidth (−10 dB) | 1 GHz (1.66%) | 1.62 GHz (2.70%) |
| Directivity | 13.76 dBi | 13.92 dBi |
| Radiation Efficiency | 85.44% | 23.77% |
| Gain | 13.03 dBi | 7.63 dBi |
| Communication Range ($P_{Tx}$ = 100 dBm and $P_{Rx}$ = −70 dBm) | 79.96 m | 23.06 m |
| Cross-Polarization Level @ Broadside | −49.50 dB | −50.40 dB |
| Maximum Cross-polarization Level (φ = 0 plane) | −45.00 dB | −43.10 dB |
| Maximum Cross-Polarization Level (φ = 90° plane) | −22.50 dB | −19.23 dB |
| Side-Lobe Level (φ = 0 plane) | −19.60 dB | −18.40 dB |
| Side-Lobe Level (φ = 90° plane) | −17.30 dB | −23.80 dB |
| Front-to-Back Ratio | 18.90 dB | 16.60 dB |

Embodiments of MEMS antennas have been presented. These embodiments include MEMS antennas with ground plane isolation from the feeding circuitry using single silicon wafer without the need for any wafer bonding or hybrid integration. Beneficially, this reduces the fabrication cost dramatically while maintaining superior electromagnetic performance at the same time. Additionally, embodiments of a method for fabricating the proposed category of MEMS antennas has been described. In one embodiment, the method may be performed in as little as three processing steps. Embodiments of the MEMS antennas offer diversity in polarization and radiation characteristics, such as: single element for linear polarization, single element for circular polarization, reconfigurable single element for radiation pattern diversity, and a wire-grid antenna array.

Embodiments of the three single antenna elements appear to exhibit very high radiation efficiency (≅94%) and high gain (≅8 dBi) on high-resistivity silicon. These remarkably high figures may be achieved at high operation frequency, specifically 60 GHz. The high radiation efficiency may lead to long battery life-time, while high gain results in enlarged range of communication. On the other hand, the three single elements on low-resistivity silicon are showing significantly less radiation efficiency (≅35%) and gain (≅3.5 dBi). This gain value is suitable for short range communication such as in-door wireless systems. For such systems, the low-resistivity silicon solution is very attractive as it is much cheaper and more compatible with the driving electronics as compared to the high-resistivity silicon solution. As for embodiments of the wire-grid array, the gain is significantly higher, 13 dBi and 7.6 dBi on high- and low-resistivity silicon, owing to the increased directivity. This enlarges the communication range of the embodiments of the wire-grid array making it sufficient for several applications even if the array is fabricated on low-resistivity silicon.

Bandwidth of embodiments of the MEMS antennas on high- and low-resistivity silicon have been observed to be around 2 GHz and 5 GHz, respectively, which are considered sufficient for the majority of applications. However, for applications require significantly large information capacity, the bandwidth of all the proposed antennas may be enhanced by adding parasitic elements in the vicinity of the driven ones. An example of this is done for the linearly polarized antenna whose bandwidth is enhanced by about 2.5% by adding parasitic elements. Various other embodiments may also benefit from the use of parasitic elements. Embodiments of such elements show one side radiation characterized by front-to-back ratio in the order of 15 dB. This value indicates that the proposed ground-plane isolation technique is functional and minimum interference between the antenna and the driving circuit can be achieved. The polarization purity of all antennas may be as high as characterized by cross-polarization level in the range of −30 dB.

All of the devices and methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A Microelectromechanical Systems (MEMS) antenna comprising:

a substrate;

a metallic layer disposed over a topside surface of the substrate, the metallic layer forming a ground plane, the ground plane having a region defining a gap disposed therein, wherein the substrate protrudes through the gap in the around plane on the topside surface of the substrate and extends outwardly from the ground plane such that a topside surface of the substrate protrusion through the gap in the ground plane is higher than the topside surface of the substrate on which the ground plane is located; and a first electromagnetic radiator element disposed over the topside surface of the substrate protrusion, the first electromagnetic element having a length and a width, the length being greater than the width.

2. The MEMS antenna of claim 1, further comprising a Through-Silicon Via (TSV) extending through the substrate from a first surface of the substrate to a second surface of the substrate.

3. The MEMS antenna of claim 2, wherein the TSV comprises a length which extends perpendicularly to a length of the first electromagnetic radiator element.

4. The MEMS antenna of claim 3, wherein the TSV comprises a first end and a second end, and the first electromagnetic radiator element comprises a first end and a second end, and wherein the first end of the TSV is disposed adjacent to the first end of the first electromagnetic radiator element.

5. The MEMS antenna of claim 4, wherein the first end of the TSV is separated from the first end of the first electromagnetic radiator element by a gap.

6. The MEMS antenna of claim 1, wherein the length of the first electromagnetic radiator element is equal to one-half a wavelength of a standing electromagnetic wave to be radiated by the first electromagnetic radiator element.

7. The MEMS antenna of claim 1, comprising:

a second protrusion disposed over the substrate within the region defining the gap, the second protrusion extending outwardly from the ground plane, the second protrusion having a length and a width, the length being greater than the width; and a second electromagnetic radiator element disposed over the second protrusion, the second electromagnetic element having a length and a width, the length being greater than the width.

8. The MEMS antenna of claim 7, wherein the length of the second electromagnetic radiator element is equal to one-half a wavelength of a standing electromagnetic wave to be radiated by the second electromagnetic radiator element.

9. The MEMS antenna of claim 7, wherein the first electromagnetic radiator element and the second electromagnetic radiator element are arranged in a linearly polarized configuration.

10. The MEMS antenna of claim 7, wherein the first electromagnetic radiator element and the second electromagnetic radiator element each comprise a half-wavelength dipole.

11. The MEMS antenna of claim 7, wherein the length of the first electromagnetic radiator element and the length of the second electromagnetic radiator element are disposed within a common plane.

12. The MEMS antenna of claim 7, further comprising a second TSV extending through the substrate from a first surface of the substrate to a second surface of the substrate, wherein the second TSV comprises a first end and a second end, and the second electromagnetic radiator element comprises a first end and a second end, and wherein the first end of the second TSV is disposed adjacent to the first end of the second electromagnetic radiator element.

13. The MEMS antenna of claim 7, wherein the length of the first electromagnetic radiator element and the length of the second electromagnetic radiator element are disposed within separate parallel planes.

14. The MEMS antenna of claim 13, wherein the second electromagnetic radiator element is a parasitic half-wavelength dipole.

15. The MEMS antenna of claim 7, further comprising:

a third protrusion disposed over the substrate within the region defining the gap, the third protrusion extending outwardly from the ground plane, the third protrusion having a length and a width, the length being greater than the width;

a third electromagnetic radiator element disposed over the third protrusion, the third electromagnetic element having a length and a width, the length being greater than the width;

a fourth protrusion disposed over the substrate within the region defining the gap, the fourth protrusion extending outwardly from the ground plane, the fourth protrusion having a length and a width, the length being greater than the width; and a fourth electromagnetic radiator element disposed over the fourth protrusion, the fourth electromagnetic element having a length and a width, the length being greater than the width.

16. The MEMS antenna of claim 15, wherein the first and second electromagnetic radiator elements are active half-wavelength dipoles, and the third and fourth electromagnetic radiator elements are parasitic halve-wavelength dipoles.

17. The MEMS antenna of claim 15, wherein the first electromagnetic radiator element is disposed at an angle that is perpendicular to an angle of the second electromagnetic radiator element, and the third electromagnetic radiator element is disposed at an angle that is perpendicular to an angle of the fourth electromagnetic radiator element; and wherein the first electromagnetic radiator element is disposed within a first plane, and the third electromagnetic radiator element is disposed within a second plane, and wherein the first plane is parallel to the second plane.

18. The MEMS antenna of claim 17, wherein the first electromagnetic radiator element, the second electromagnetic radiator element, the third electromagnetic radiator element, and the fourth electromagnetic radiator element are arranged in a circularly polarized configuration.

19. The MEMS antenna of claim 7, wherein the first electromagnetic radiator element and the second electromagnetic radiator element are coupled together by a ring coupler.

20. The MEMS antenna of claim 19, wherein the ring coupler comprises a microstrip line disposed on a surface of the substrate that is opposite a surface of the substrate over which the first electromagnetic radiator element and the second electromagnetic radiator element are disposed.

21. The MEMS antenna of claim 19, wherein the ring coupler comprises a first port and a second port, and wherein power delivered through the first port is delivered equally to the first electromagnetic radiator element and the second electromagnetic radiator element, but with a one hundred and eighty degree phase shift, and wherein power delivered through the second port is delivered equally to the first electromagnetic radiator element and the second electromagnetic radiator element, with a zero degree phase shift.

22. The MEMS antenna of claim 21, wherein the first electromagnetic radiator element and the second electromagnetic radiator element are configured to operate as a dipole antenna when power is applied to the first port and configured to operate as a monopole antenna when power is applied to the second port.

23. The MEMS antenna of claim 1, further comprising:

a plurality of additional protrusions disposed over the substrate within the region defining the gap, the plurality of additional protrusions extending outwardly from the ground plane, the plurality of additional protrusions each having a length and a width, the length being greater than the width; and a plurality of additional electromagnetic radiator elements, each disposed over one of the plurality of additional protrusions, the plurality additional electromagnetic elements each having a length and a width, the length being greater than the width;

wherein the first electromagnetic radiator element and the plurality of additional electromagnetic radiator elements are arranged in a wire-grid array configuration.

24. A system comprising:

a substrate having a first surface and a second surface, the first surface being disposed opposite the second surface;

a MEMS antenna disposed over the first surface, the MEMS antenna comprising:

a metallic layer disposed over the first surface of the substrate, the metallic layer forming a ground plane, the ground plane having a region defining a gap disposed therein, wherein the substrate protrudes through the map in the around plane on the first surface of the substrate and extends outwardly from the ground plane such that a topside surface of the substrate protrusion through the gap in the around plane is further from the second surface of the substrate than the first surface of the substrate on which the ground plane is located; and a first electromagnetic radiator element disposed over the topside surface of the substrate protrusion, the first electromagnetic element having a length and a width, the length being greater than the width; and an antenna driver circuit coupled to the second surface, the antenna driver circuit being coupled to the MEMS antenna by one or more vias extending from the first surface through the substrate to the second surface.

* * * * *

UNITED STATES PATENT AND TRADEMARK OFFICE

CERTIFICATE OF CORRECTION

PATENT NO. : 9,899,725 B2
APPLICATION NO. : 13/516792
DATED : February 20, 2018
INVENTOR(S) : Ezzeldin A. Soliman et al.

It is certified that error appears in the above-identified patent and that said Letters Patent is hereby corrected as shown below:

Claim 1, Column 18, Line 12:
Replace "around" with -- ground --.

Claim 24, Column 20, Line 44:
Replace "map in the around" with -- gap in the ground --.

Claim 24, Column 20, Line 47:
Replace "around" with -- ground --.

Signed and Sealed this
Fifth Day of June, 2018

Andrei Iancu
*Director of the United States Patent and Trademark Office*